(12) United States Patent
Chao et al.

(10) Patent No.: US 10,049,983 B2
(45) Date of Patent: Aug. 14, 2018

(54) SEMICONDUCTOR DEVICE AND METHOD

(71) Applicant: Taiwan Semiconductor Manufacturing Company, Ltd., Hsin-Chu (TW)

(72) Inventors: Cha-Hsin Chao, Taipei (TW); Chih-Hao Chen, Hsin-Chu (TW); Hsin-Yi Tsai, Hsin Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/987,217

(22) Filed: Jan. 4, 2016

(65) Prior Publication Data
US 2016/0118347 A1 Apr. 28, 2016

Related U.S. Application Data

(62) Division of application No. 13/963,731, filed on Aug. 9, 2013, now Pat. No. 9,230,854.

(60) Provisional application No. 61/809,779, filed on Apr. 8, 2013.

(51) Int. Cl.
| H01L 23/48 | (2006.01) |
| H01L 23/52 | (2006.01) |
| H01L 29/40 | (2006.01) |
| H01L 23/532 | (2006.01) |
| H01L 23/528 | (2006.01) |
| H01L 21/768 | (2006.01) |
| H01L 21/311 | (2006.01) |
| H01L 23/522 | (2006.01) |

(52) U.S. Cl.
CPC .. *H01L 23/53295* (2013.01); *H01L 21/31144* (2013.01); *H01L 21/76811* (2013.01); *H01L 21/76813* (2013.01); *H01L 21/76816* (2013.01); *H01L 23/528* (2013.01); *H01L 23/5226* (2013.01); *H01L 23/5283* (2013.01); *H01L 2924/0002* (2013.01)

(58) Field of Classification Search
USPC .......... 257/774, E21.495, E21.489, E21.578, 257/E21.579; 438/667, 597, 624, 626, 438/638, 622, 634, 761
See application file for complete search history.

(56) References Cited

U.S. PATENT DOCUMENTS

| 6,037,664 A | 3/2000 | Zhao et al. |
| 6,215,189 B1 | 4/2001 | Toyoda et al. |
| 6,218,079 B1 | 4/2001 | Shin et al. |
| 6,225,211 B1 | 5/2001 | Tsui |
| 6,271,141 B2 | 8/2001 | Juengling et al. |
| 6,319,814 B1 | 11/2001 | Tsai et al. |
| 6,331,479 B1 | 12/2001 | Li et al. |

(Continued)

OTHER PUBLICATIONS

Williams et al. "Etch Rates for Micromachining Processing—Part II", Dec. 2003, Journal of Microelectromechanical Systems, vol. 12 No. 6, pp. 761-778.*

*Primary Examiner* — Telly Green
(74) *Attorney, Agent, or Firm* — Slater Matsil, LLP

(57) ABSTRACT

A system and method for a semiconductor device are provided. An embodiment comprises a dielectric layer, a hard mask layer over the dielectric layer, and a capping layer over the hard mask layer. A multi-patterning process is performed to form an interconnect using the capping layer as a mask to form an opening for the interconnect.

20 Claims, 21 Drawing Sheets

(56) References Cited

U.S. PATENT DOCUMENTS

| | | |
|---|---|---|
| 6,383,913 B1 | 5/2002 | Tsai et al. |
| 6,391,795 B1 | 5/2002 | Catabay et al. |
| 6,400,030 B1 | 6/2002 | Wang et al. |
| 6,417,094 B1 | 7/2002 | Zhao et al. |
| 6,475,929 B1 | 11/2002 | Gabriel et al. |
| 6,528,409 B1 * | 3/2003 | Lopatin ............... H01L 21/288 257/E21.174 |
| 6,537,923 B1 | 3/2003 | Bhatt et al. |
| 6,559,033 B1 | 5/2003 | Hu et al. |
| 6,589,837 B1 * | 7/2003 | Ban ................. H01L 27/10814 257/E21.649 |
| 6,603,206 B2 | 8/2003 | Wang et al. |
| 6,876,079 B2 | 4/2005 | Aoyama |
| 6,951,826 B2 | 10/2005 | Bencher et al. |
| 6,989,603 B2 | 1/2006 | Zhang |
| 7,056,646 B1 | 6/2006 | Amblard et al. |
| 7,115,993 B2 | 10/2006 | Wetzel et al. |
| 7,531,448 B2 | 5/2009 | Wang |
| 7,811,930 B2 | 10/2010 | Wang |
| 7,838,415 B2 | 11/2010 | Chang et al. |
| 8,008,206 B2 | 8/2011 | Liang et al. |
| 8,034,712 B2 | 10/2011 | Chang et al. |
| 8,222,151 B2 | 7/2012 | Liang et al. |
| 2002/0001952 A1 | 1/2002 | Chooi et al. |
| 2002/0171147 A1 | 11/2002 | Yew et al. |
| 2002/0175414 A1 | 11/2002 | Teh et al. |
| 2004/0053501 A1 | 3/2004 | Brennan et al. |
| 2004/0056359 A1 | 3/2004 | Lee et al. |
| 2004/0152299 A1 | 8/2004 | Mahalingam et al. |
| 2005/0017324 A1 | 1/2005 | Yamamoto |
| 2005/0167839 A1 | 8/2005 | Wetzel et al. |
| 2005/0233519 A1 | 10/2005 | Chang et al. |
| 2005/0277302 A1 | 12/2005 | Nguyen et al. |
| 2006/0006546 A1 | 1/2006 | Colburn |
| 2006/0148192 A1 | 7/2006 | Chou et al. |
| 2006/0226549 A1 | 10/2006 | Yu et al. |
| 2006/0246718 A1 | 11/2006 | Frohberg et al. |
| 2006/0292854 A1 | 12/2006 | Wang |
| 2007/0077780 A1 | 4/2007 | Wang et al. |
| 2008/0171434 A1 | 7/2008 | Chang et al. |
| 2008/0318414 A1 | 12/2008 | Jeong |
| 2009/0176378 A1 | 7/2009 | Wang |
| 2010/0022084 A1 | 1/2010 | Chen et al. |
| 2011/0021021 A1 | 1/2011 | Chang et al. |
| 2012/0100717 A1 | 4/2012 | Lii et al. |
| 2013/0270709 A1 | 10/2013 | Tseng et al. |

* cited by examiner

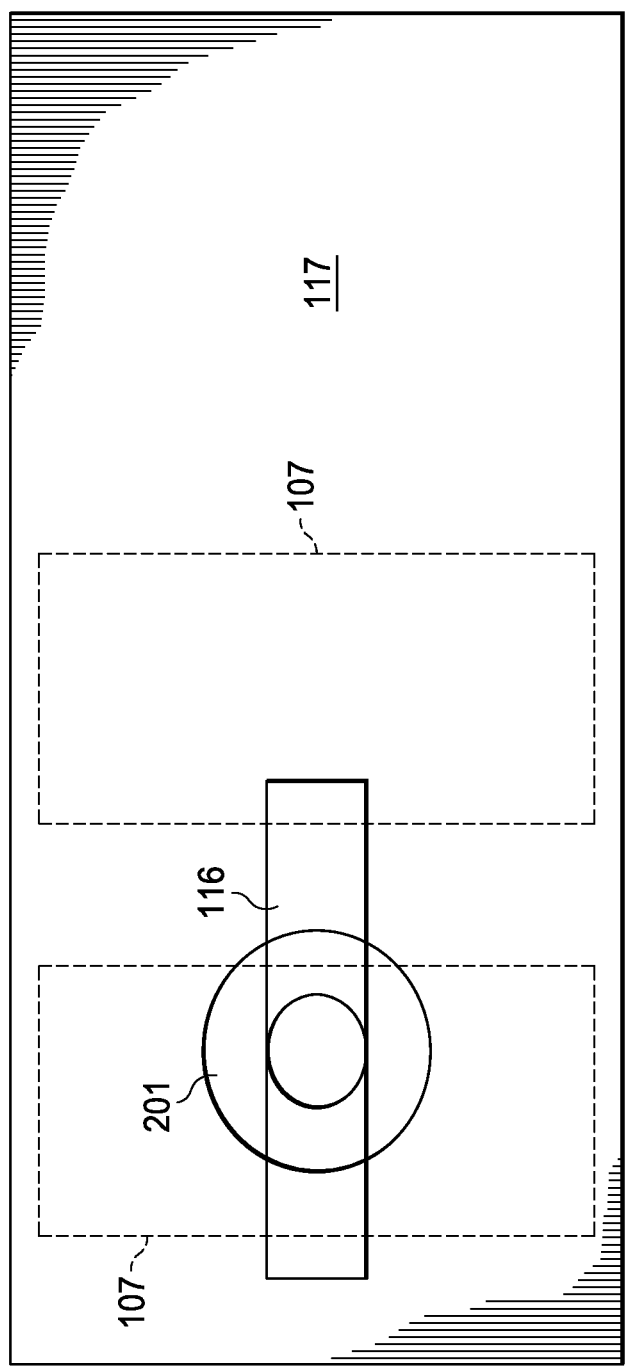

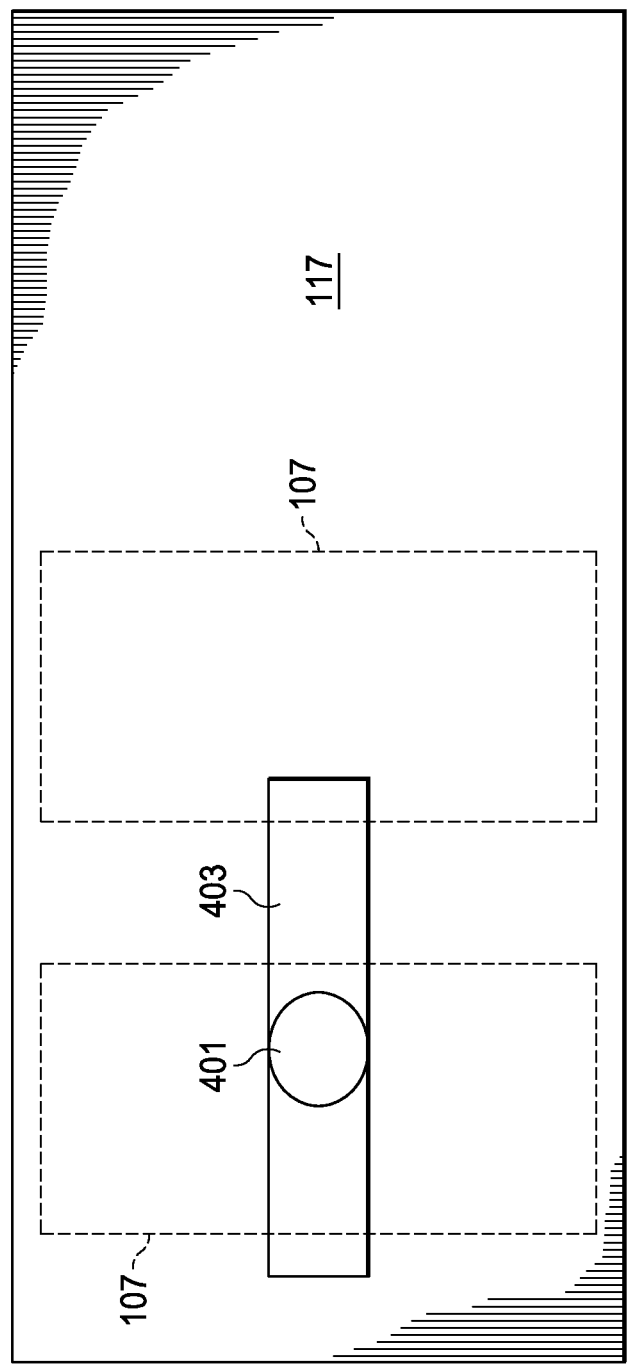

SEMICONDUCTOR DEVICE AND METHOD

This application is a division of U.S. patent application Ser. No. 13/963,731, filed on Aug. 9, 2013, entitled "Semiconductor Device and Method," which claims the benefit of U.S. Provisional Application Ser. No. 61/809,779, filed on Apr. 8, 2013, entitled "Self-Aligned via Approach Employing Nitride or Carbide-Based Capping Layer in Multi-Patterning," which applications are hereby incorporated herein by reference.

BACKGROUND

Generally, active devices and passive devices are formed on and in a semiconductor substrate. Once formed, these active devices and passive devices may be connected to each other and to external devices using a series of conductive and insulative layers. These layers may help to interconnect the various active devices and passive devices as well as provide an electrical connection to external devices through, for example, a contact pad.

To form these interconnections within these layers, a series of photolithographic, etching, deposition, and planarization techniques may be employed. However, the use of such techniques has become more complicated as the size of active and passive devices have been reduced, causing a reduction in the size of the interconnects to be desired as well. As such, improvements in the formation and structure of the interconnects is desired in order to make the overall devices smaller, cheaper, and more efficient with fewer defects or problems.

BRIEF DESCRIPTION OF THE DRAWINGS

For a more complete understanding of the present embodiments, and the advantages thereof, reference is now made to the following descriptions taken in conjunction with the accompanying drawings, in which:

FIGS. 2A-2C illustrate a formation of a first opening in accordance with an embodiment;

FIGS. 4A-4C illustrate a formation of an interconnect within the trench and via opening in accordance with an embodiment.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely a via-first dual damascene process and structure in a double-patterning lithography process at a 20 nm technology node. Other embodiments may also be applied, however, to other interconnecting process and structures.

Figure 1A:
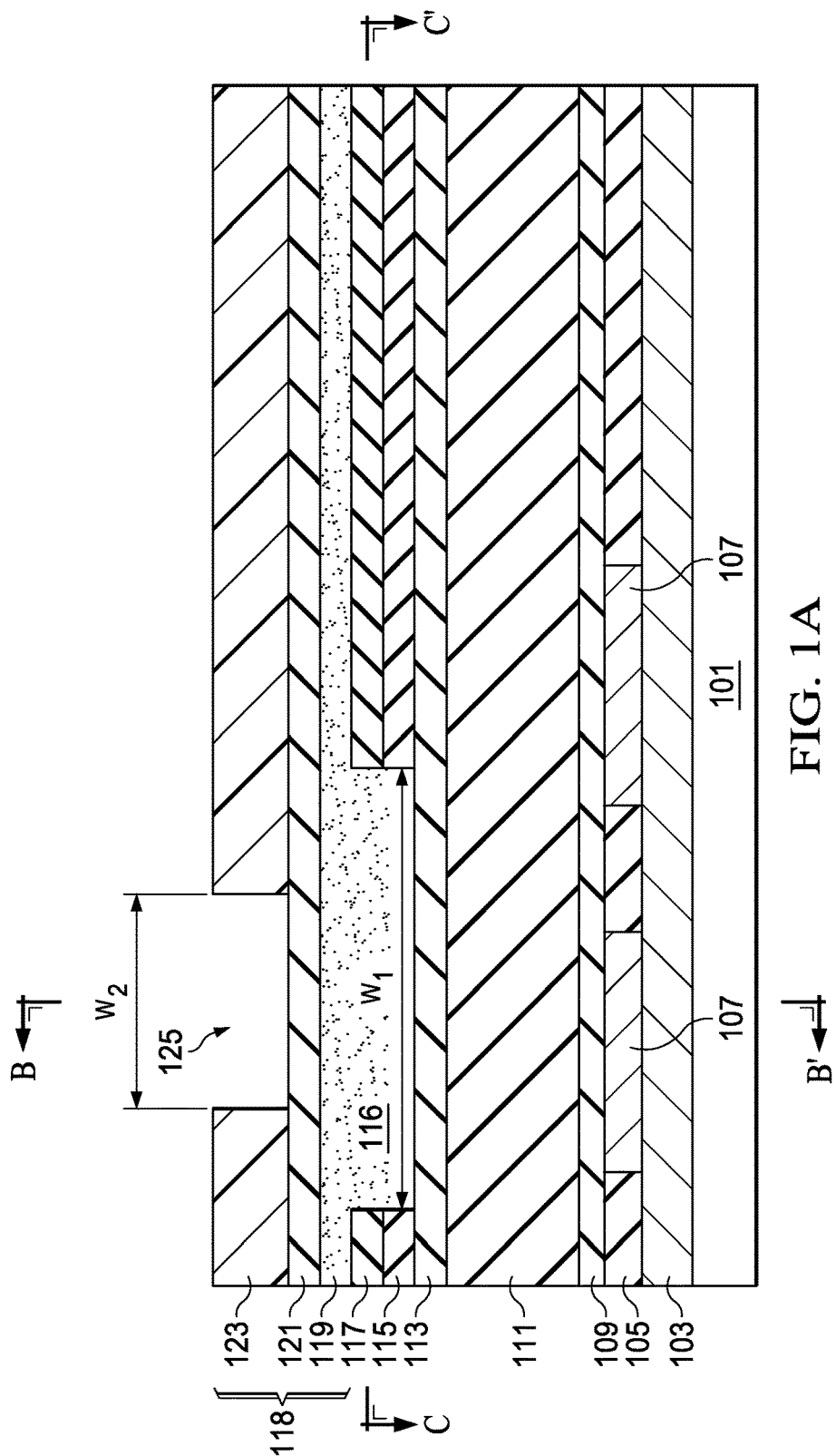
FIGS. 1A-1C illustrate an intermediate structure in a manufacture of a semiconductor substrate in accordance with an embodiment.
Figure 1B:
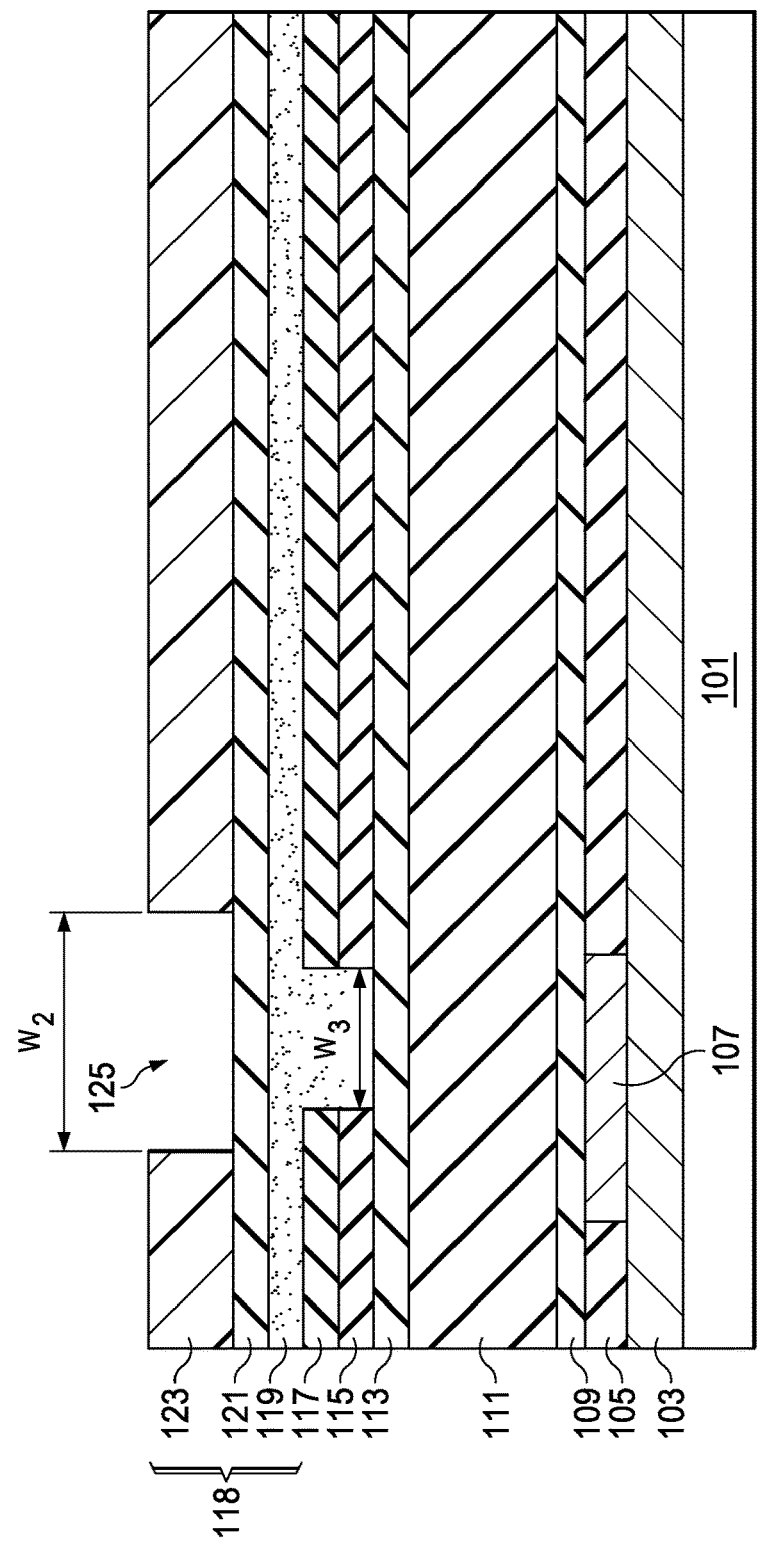
Figure 1C:
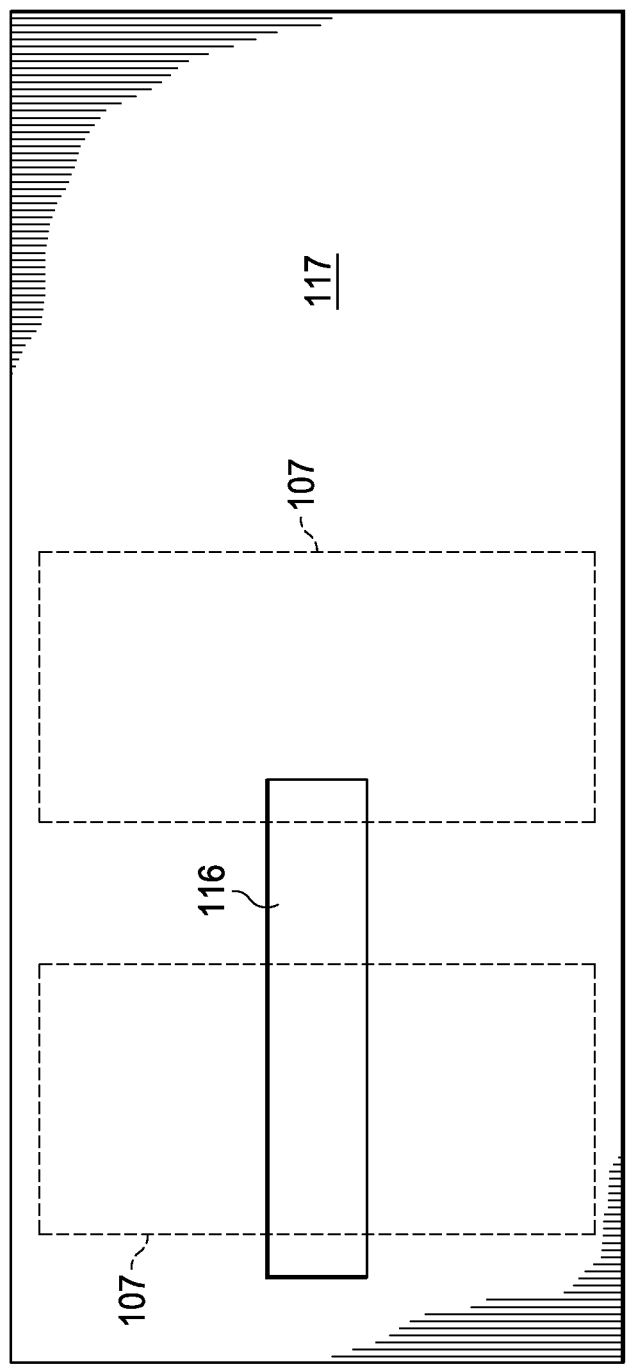

With reference now to FIGS. 1A-1C, there is shown a portion of a semiconductor device 100 with a substrate 101, metallization layers 103, a first dielectric layer 105 and conductive regions 107 within the first dielectric layer 105. In these figures FIG. 1B is a cross-sectional view of FIG. 1A along line B-B' in FIG. 1A. Additionally, FIG. 1C is a top down view of FIG. 1A along line C-C' in FIG. 1A.

In these figures the substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

Active devices may be formed on and/or within the substrate 101. As one of skill in the art will recognize, a wide variety of active and passive devices such as transistors, capacitors, resistors, inductors and the like may be used to generate the desired structural and functional requirements of the design for the semiconductor device 100. The active devices may be formed using any suitable methods either within or else on the surface of the substrate 101.

The metallization layers 103 are formed over the substrate 101 and the active devices and are designed to connect the various active devices to form functional circuitry. While illustrated in FIG. 1A as a single layer, the metallization layers 103 are formed of alternating layers of dielectric and conductive material and may be formed through any suitable process (such as deposition, damascene, dual damascene, etc.). In an embodiment there may be four layers of metallization, but the precise number of metallization layers 103 is dependent upon the design of the semiconductor device 100.

The first dielectric layer 105 is formed over the metallization layers 103. In an embodiment the first dielectric layer 105 may be a dielectric material such as a low-k or extremely low-k dielectric materials, formed using a process such as deposition, spin-on, or a deposition/porogen removal process, depending upon the material chosen. However, any other suitable dielectric material formed using any other suitable process may alternatively be utilized.

The conductive regions 107 are formed within the first dielectric layer 105. In an embodiment the conductive regions 107 are regions to which an interconnect 401 with a trench portion 403 and a via portion 405 (not illustrated in FIG. 1A but illustrated and described below with respect to FIGS. 4A-4C), will make a physical and/or electrical connection. In an embodiment the conductive regions 107 are conductive lines made from, e.g., copper, although any other suitably conductive material may alternatively be utilized. The conductive regions 107 may be formed using a damascene process, by which a portion of the first dielectric layer 105 is removed to form an opening, the opening is filled and overfilled with the conductive material FIGS. 1A-1C additionally illustrate the formation of a first contact etch stop layer (CESL) 109, a second dielectric layer 111, a first capping layer 113, and a hard mask layer 115 over the conductive regions 107. The first CESL 109 may be formed over the substrate 101 and the conductive regions 107. The first CESL 109 may be used to protect the substrate 101 and the conductive regions 107 from damage caused by further processing and provide for a control point for further etching processes. In one embodiment, the first CESL 109 may be formed of silicon nitride using plasma enhanced chemical vapor deposition (PECVD), although other materials such as nitride, oxynitride, carbide, boride, combinations thereof, or the like, and alternative techniques of forming the first CESL 109, such as low pressure CVD (LPCVD), PVD, or the like, could alternatively be used. The first CESL 109 may have a thickness of between about 50 Å and about 2,000 Å, such as about 200 Å.

Once the first CESL 109 has been formed, the second dielectric layer 111 may be formed the first CESL 109. The second dielectric layer 111 may be, e.g., a low-k dielectric film intended to help isolate the interconnect 401 (not shown in FIGS. 1A-1C but illustrated and discussed below with respect to FIGS. 4A-4C below) from other structures within the semiconductor device 100. By isolating the interconnect 401, the resistance-capacitance (RC) delay of the interconnect 401 may be reduced, thereby improving the overall efficiency and speed of electricity through the interconnect 401.

In an embodiment the second dielectric layer 111 is formed by initially forming a precursor layer over the first CESL 109. The precursor layer may comprise both a matrix material and a porogen interspersed within the matrix material, or may alternatively comprise the matrix material without the porogen. In an embodiment the precursor layer may be formed, e.g., by co-depositing the matrix and the porogen using a process such as PECVD where the matrix material is deposited at the same time as the porogen, thereby forming the precursor layer with the matrix material and the porogen mixed together. However, as one of ordinary skill in the art will recognize, co-deposition using a simultaneous PECVD process is not the only process that may be used to form the precursor layer. Any suitable alternative process, such as premixing the matrix material and the porogen material as a liquid and then spin-coating the mixture onto the first CESL 109, may also be utilized.

The precursor layer may be formed to a thickness sufficient to provide the isolation and routing characteristics that are desired of the second dielectric layer 111. In an embodiment, the precursor layer may be formed to a thickness of between about 10 Å and about 1000 Å, such as about 300 Å. However, these thicknesses are meant to be illustrative only, and are not intended to limit the scope of the embodiments, as the precise thickness of the precursor layer may be any suitable desired thickness.

The matrix material, or base dielectric material, may be formed using a process such as PECVD, although any suitable process, such as a CVD, PVD, or even spin-on coating, may alternatively be utilized. The PECVD process may utilize precursors such as methyldiethoxy silane (DEMS), although other precursors such as other silanes, alkylsilanes (e.g., trimethylsilane and tetramethylsilane), alkoxysilanes (e.g., methyltriethoxysilane (MTEOS), methyltrimethoxysilane (MTMOS), methyldimethoxysilane (MDMOS), trimethylmethoxysilane (TMMOS) and dimethyldimethoxysilane (DMDMOS)), linear siloxanes and cyclic siloxanes (e.g., octamethylcyclotetrasiloxane (OMCTS) and tetramethylcyclotetrasiloxane (TMCTS)), combinations of these, and the like may alternatively be utilized. However, as one of ordinary skill in the art will recognize, the materials and processes listed herein are merely illustrative and are not meant to be limiting to the embodiments, as any other suitable matrix precursors may alternatively be utilized.

The porogen may be a molecule that can be removed from the matrix material after the matrix material has set in order to form pores within the matrix and thereby reduce the overall value of the dielectric constant of the second dielectric layer 111. The porogen may be a material that is big enough to form the pores while also remaining small enough such that the size of the individual pores does not overly displace the matrix material. As such, the porogen may comprise an organic molecule.

After the precursor layer has been formed with the porogen dispersed within the matrix material, the porogen is removed from the matrix material to form the pores within the matrix material. In an embodiment the removal of the porogen is performed by an annealing process which can break down and vaporize the porogen material, thereby allowing the porogen material to diffuse and leave the matrix material, thereby leaving behind a structurally intact porous dielectric material as the second dielectric layer 111. For example, an anneal of between about 200° C. and about 500° C., such as about 400° C., for between about 10 seconds and about 600 seconds, such as about 200 seconds, may be utilized.

However, as one of ordinary skill in the art will recognize, the thermal process described above is not the only method that may be utilized to remove the porogen from the matrix material to form the second dielectric layer 111. Other suitable processes, such as irradiating the porogen with UV radiation to decompose the porogen or utilizing microwaves to decompose the porogen, may alternatively be utilized. These and any other suitable process to remove all or a portion of the porogen are all fully intended to be included within the scope of the embodiments.

Additionally, while the above discussion describes a low-k dielectric material being formed and used as the material for the second dielectric layer 111, this is only intended to be an illustrative embodiment and is not intended to limit the embodiments to only these materials. Rather, any suitable dielectric material, such as silicon oxide or any other suitable dielectric formed using any suitable process, may alternatively be utilized. All such materials and processes are fully intended to be included within the scope of the embodiments.

The first capping layer 113 is formed over the second dielectric layer 111 in order to protect the underlying second dielectric layer 111 from being damaged in subsequent processing. In an embodiment the first capping layer 113 is SiN, SiCN, SiON, SiC, Si-rich oxide, combinations thereof, or the like, and may be formed by CVD, spin-on-glass process, flow-able CVD, atomic layer deposition (ALD), molecular layer deposition (MLD), furnace, or the like. However, any other suitable materials and processes may alternatively be utilized.

After the first capping layer 113 has been formed over the second dielectric layer 111, a hard mask layer 115 is formed over the first capping layer 113. In an embodiment the hard mask layer 115 comprises a dielectric material such as titanium nitride, silicon nitride, silicon oxynitride, combinations of these, or the like. The hard mask layer 115 may be formed using a process such as CVD, PECVD, ALD, or the like. However, any other suitable material and method of formation may alternatively be utilized.

A second capping layer 117 is formed over the hard mask layer 115 in order to gain additional selectivity to the second dielectric layer 111, to help constrain the dimension of the subsequently formed via portion 405 (not illustrated in FIGS. 1A-1C but illustrated and described further below with respect to FIGS. 4A-4C), to help avoid ashing damage to a metal hard mask in multi-patterning technology, and to avoid critical dimension mismatch in multi-patterning technology. In an embodiment the second capping layer 117 is a material with a selectivity of between about 1:15 to 1:5 in relation to the second dielectric layer 111, such as a nitride or carbide capping layer. In particular embodiments, the second capping layer 117 is a material such as silicon nitride, silicon carbon nitride, silicon carbon oxynitride, boron nitride, silicon carbide, or the like. In a particular embodiment in which the second capping layer 117 is silicon nitride (SiNx), the nitrogen molar percentage (x) can be from 0-1.33.

The second capping layer 117 may be formed using a deposition method such as CVD, plasma-enhanced CVD, sputtering, evaporation, ALD, or the like. In an embodiment the second capping layer 117 is formed to a thickness of between about 100 Å to about 2000 Å, such as between about 100 Å and about 500 Å.

However, as one of ordinary skill in the art will recognize, while the above discussion describes specific embodiments for the second capping layer 117, this is only intended to be an illustrative embodiment and is not intended to limit the embodiments to only those processes and materials discussed. Rather, any other suitable material formed using any suitable process, may alternatively be utilized. All such materials and processes are fully intended to be included within the scope of the embodiments.

Once the second capping layer 117 and the hard mask layer 115 have been formed, the second capping layer 117 and the hard mask layer 115 may be patterned to dimensions for a subsequently formed trench portion 403 (not illustrated in FIGS. 1A-1C but illustrated and discussed below with respect to FIGS. 4A-4C). In an embodiment a first photoresist (not individually illustrated) may be placed over the second capping layer 117, exposed to energy such as light in a desired pattern, and developed to remove portions of the first photoresist. Once patterned, the first photoresist may be used as a mask during an etching process to remove those portions of the second capping layer 117 and the hard mask layer 115 that were exposed by the developing of the first photoresist and to form a first opening 116. Once completed, the first photoresist may be removed using a process such as ashing.

The first opening 116 may be formed to have a first width $W_1$ in this view that corresponds to a desired width of the trench portion 403. In an embodiment the first width $W_1$ is between about 50 nm and about 5000 nm, such as about 2000 nm. However, any suitable width may alternatively be utilized.

Once the second capping layer 117 and the hard mask layer 115 have been patterned, a second photoresist 118 may be placed over the second capping layer 117 and the hard mask layer 115, with the second photoresist 118 filling those regions out of which the second capping layer 117 and the hard mask layer 115 were removed. In an embodiment the second photoresist 118 is a tri-layer photoresist, with a bottom anti-reflective coating (BARC) layer 119, an intermediate mask layer 121, and a top photoresist layer 123.

In an embodiment the BARC layer 119 may be a nitrogen-free anti-reflective coating and may comprise a polymer resin, a catalyst, and a cross-linking agent, all of which are placed into a solvent for dispersal. The polymer resin comprises a polymer chain with repeating units, such as a cross-linking monomer and a monomer with chromophore units. In an embodiment the monomer with the chromophore unit may comprise vinyl compounds containing substituted and unsubstituted phenyl, substituted and unsubstituted anthracyl, substituted and unsubstituted phenanthryl, substituted and unsubstituted naphthyl, substituted and unsubstituted heterocyclic rings containing heteroatoms such as oxygen, nitrogen, sulfur, or combinations thereof, such as pyrrolidinyl, pyranyl, piperidinyl, acridinyl, quinolinyl. The substituents in these units may be any hydrocarbyl group and may further contain heteroatoms, such as, oxygen, nitrogen, sulfur or combinations thereof, such as alkylenes, ester, ethers, combinations of these, or the like, with a number of carbon atoms between 1 and 12.

The cross-linking monomer may be used to cross-link the monomer with other polymers within the polymer resin to modify the solubility of the BARC layer 119, and may optionally have an acid labile group. In a particular embodiment the cross-linking monomer may comprise a hydrocarbon chain that also comprises, e.g., a hydroxyl group, a carboxyl acid group, a carboxylic ester group, epoxy groups, urethane groups, amide groups, combinations of the, and the like.

The catalyst may be a compound that is used to generate a chemically active species and initiate a cross-linking reaction between the polymers within the polymer resin and may be, e.g., a thermal acid generator, a photoacid generator, a photobase generator, suitable combinations of these, or the like. In an embodiment in which the catalyst is a thermal acid generator, the catalyst will generate an acid when sufficient heat is applied to the BARC layer 119. Specific examples of the thermal acid generator include butane sulfonic acid, triflic acid, nanoflurobutane sulfonic acid, nitrobenzyl tosylates, such as 2-nitrobenzyl tosylate, 2,4-dinitrobenzyl tosylate, 2,6-dinitrobenzyl tosylate, 4-nitrobenzyl tosylate; benzenesulfonates such as 2-trifluoromethyl-6-nitrobenzyl 4-chlorobenzenesulfonate, 2-trifluoromethyl-6-nitrobenzyl 4-nitro benzenesulfonate; phenolic sulfonate esters such as phenyl, 4-methoxybenzenesulfonate; alkyl ammonium salts of organic acids, such as triethylammonium salt of 10-camphorsulfonic acid, combinations of these, or the like.

The cross-linking agent may also be added to the BARC layer 119. The cross-linking agent reacts with the polymers within the polymer resin within the BARC layer 119, assisting in increasing the cross-linking density of the photoresist, which helps to improve the resist pattern and resistance to dry etching. In an embodiment the cross-linking agent may be an melamine based agent, a urea based agent, ethylene urea based agent, propylene urea based agent, glycoluril based agent, an aliphatic cyclic hydrocarbon having a hydroxyl group, a hydroxyalkyl group, or a combination of these, oxygen containing derivatives of the aliphatic cyclic hydrocarbon, glycoluril compounds, etherified amino resins, a polyether polyol, a polyglycidil ether, a vinyl ether, a triazine, combinations of these, or the like.

The materials for the BARC layer may be placed into a BARC solvent for dispersal. In an embodiment the BARC solvent may be an organic solvent, and may comprise any suitable solvent such as ketones, alcohols, polyalcohols, ethers, glycol ethers, cyclic ethers, aromatic hydrocarbons, esters, propionates, lactates, lactic esters, alkylene glycol monoalkyl ethers, alkyl lactates, alkyl alkoxypropionates, cyclic lactones, monoketone compounds that contain a ring, alkylene carbonates, alkyl alkoxyacetate, alkyl pyruvates, lactate esters, ethylene glycol alkyl ether acetates, diethylene glycols, propylene glycol alkyl ether acetates, alkylene glycol alkyl ether esters, alkylene glycol monoalkyl esters, or the like.

Once the material for the BARC layer 119 has been prepared, the material for the BARC layer 119 may be utilized by initially applying the material for the BARC layer 119 onto the substrate 101. The material for the BARC layer 119 may be applied to the second capping layer 117 so that the material for the BARC layer 119 coats an upper exposed surface of the second capping layer 117, and may be applied using a process such as a spin-on coating process, a dip coating method, an air-knife coating method, a curtain coating method, a wire-bar coating method, a gravure coating method, a lamination method, an extrusion coating method, combinations of these, or the like. In an embodiment the material for the BARC layer 119 may be applied such that it has a thickness of between about 50 nm and about 500 nm, such as about 300 nm.

The intermediate mask layer 121 may be placed over the BARC layer 119. In an embodiment the intermediate mask layer 121 is a hard mask material such as silicon nitride, oxides, oxynitrides, silicon carbide, combinations of these, or the like. The hard mask material for the intermediate mask layer 121 may be formed through a process such as chemical vapor deposition (CVD), although other processes, such as plasma enhanced chemical vapor deposition (PECVD), low pressure chemical vapor deposition (LPCVD), spin-on coating, or even silicon oxide formation followed by nitridation, may alternatively be utilized. Any suitable method or combination of methods to form or otherwise place the hardmask material may be utilized, and all such methods or combination are fully intended to be included within the scope of the embodiments. The intermediate mask layer 121 may be formed to a thickness of between about 100 Å and about 800 Å, such as about 300 Å.

The top photoresist layer 123 is placed over the intermediate mask layer 121. In an embodiment the top photoresist layer 123 includes a photoresist polymer resin along with one or more photoactive compounds (PACs) in a photoresist solvent. In an embodiment the photoresist polymer resin may comprise a hydrocarbon structure (such as a alicyclic hydrocarbon structure) that contains one or more groups that will decompose (e.g., acid labile groups) or otherwise react when mixed with acids, bases, or free radicals generated by the PACs (as further described below). In an embodiment the hydrocarbon structure comprises a repeating unit that forms a skeletal backbone of the photoresist polymer resin. This repeating unit may include acrylic esters, methacrylic esters, crotonic esters, vinyl esters, maleic diesters, fumaric diesters, itaconic diesters, (meth)acrylonitrile, (meth)acrylamides, styrenes, vinyl ethers, combinations of these, or the like.

Additionally, the top photoresist layer 123 also comprises one or more PACs. The PACs may be photoactive components such as photoacid generators, photobase generators, free-radical generators, or the like, and the PACs may be positive-acting or negative-acting. In an embodiment in which the PACs are a photoacid generator, the PACs may comprise halogenated triazines, onium salts, diazonium salts, aromatic diazonium salts, phosphonium salts, sulfonium salts, iodonium salts, imide sulfonate, oxime sulfonate, diazodisulfone, disulfone, o-nitrobenzylsulfonate, sulfonated esters, halogenerated sulfonyloxy dicarboximides, diazodisulfones, α-cyanooxyamine-sulfonates, imidesulfonates, ketodiazosulfones, sulfonyldiazoesters, 1,2-di(arylsulfonyl)hydrazines, nitrobenzyl esters, and the s-triazine derivatives, suitable combinations of these, and the like.

The individual components of the top photoresist layer 123 may be placed into a photoresist solvent in order to aid in the mixing and placement of the top photoresist layer 123.

To aid in the mixing and placement of the top photoresist layer 123, the photoresist solvent is chosen at least in part based upon the materials chosen for the photoresist polymer resin as well as the PACs. In particular, the photoresist solvent is chosen such that the photoresist polymer resin and the PACs can be evenly dissolved into the photoresist solvent.

In an embodiment the photoresist solvent may be an organic solvent, and may comprise any suitable solvent such as ketones, alcohols, polyalcohols, ethers, glycol ethers, cyclic ethers, aromatic hydrocarbons, esters, propionates, lactates, lactic esters, alkylene glycol monoalkyl ethers, alkyl lactates, alkyl alkoxypropionates, cyclic lactones, monoketone compounds that contain a ring, alkylene carbonates, alkyl alkoxyacetate, alkyl pyruvates, lactate esters, ethylene glycol alkyl ether acetates, diethylene glycols, propylene glycol alkyl ether acetates, alkylene glycol alkyl ether esters, alkylene glycol monoalkyl esters, or the like.

Optionally, a photoresist cross-linking agent may also be added to the top photoresist layer 123. The photoresist cross-linking agent reacts with the photoresist polymer resin within the top photoresist layer 123 after exposure, assisting in increasing the cross-linking density of the photoresist, which helps to improve the resist pattern and resistance to dry etching. In an embodiment the photoresist cross-linking agent may be an melamine based agent, a urea based agent, ethylene urea based agent, propylene urea based agent, glycoluril based agent, an aliphatic cyclic hydrocarbon having a hydroxyl group, a hydroxyalkyl group, or a combination of these, oxygen containing derivatives of the aliphatic cyclic hydrocarbon, glycoluril compounds, etherified amino resins, combinations of these, or the like.

Once ready, the top photoresist layer 123 may be utilized by initially applying the top photoresist layer 123 onto the intermediate mask layer 121. The top photoresist layer 123 may be applied to the intermediate mask layer 121 so that the top photoresist layer 123 coats an upper exposed surface of the intermediate mask layer 121, and may be applied using a process such as a spin-on coating process, a dip coating method, an air-knife coating method, a curtain coating method, a wire-bar coating method, a gravure coating method, a lamination method, an extrusion coating method, combinations of these, or the like. In an embodiment the top photoresist layer 123 may be applied such that it has a thickness over the surface of the intermediate mask layer 121 of between about 10 nm and about 300 nm, such as about 150 nm.

Once applied, the top photoresist layer 123 may be imaged by exposing the top photoresist layer 123 to a patterned energy source such as light. The light will induce a reaction of the PACs, which in turn reacts with the photoresist polymer resin to chemically alter those portions of the top photoresist layer 123 to which the energy impinges. After the top photoresist layer 123 has been exposed, the top photoresist layer 123 may be developed to form a second opening 125. The top photoresist layer 123 may be developed using either a positive tone developer or a negative tone developer, depending upon the desired pattern for the top photoresist layer 123. In an embodiment in which the exposed region of the top photoresist layer 123 is desired to be removed to form a positive tone, a positive tone developer such as a basic aqueous solution may be utilized to remove those portions of the top photoresist layer 123 which were exposed to the patterned energy and which have had their solubility modified and changed through the chemical reactions. If a negative tone development is desired, an organic solvent or critical fluid may be utilized to remove those portions of the top photoresist layer 123 which were not exposed to the energy and, as such, retain their original solubility.

Figure 4A:
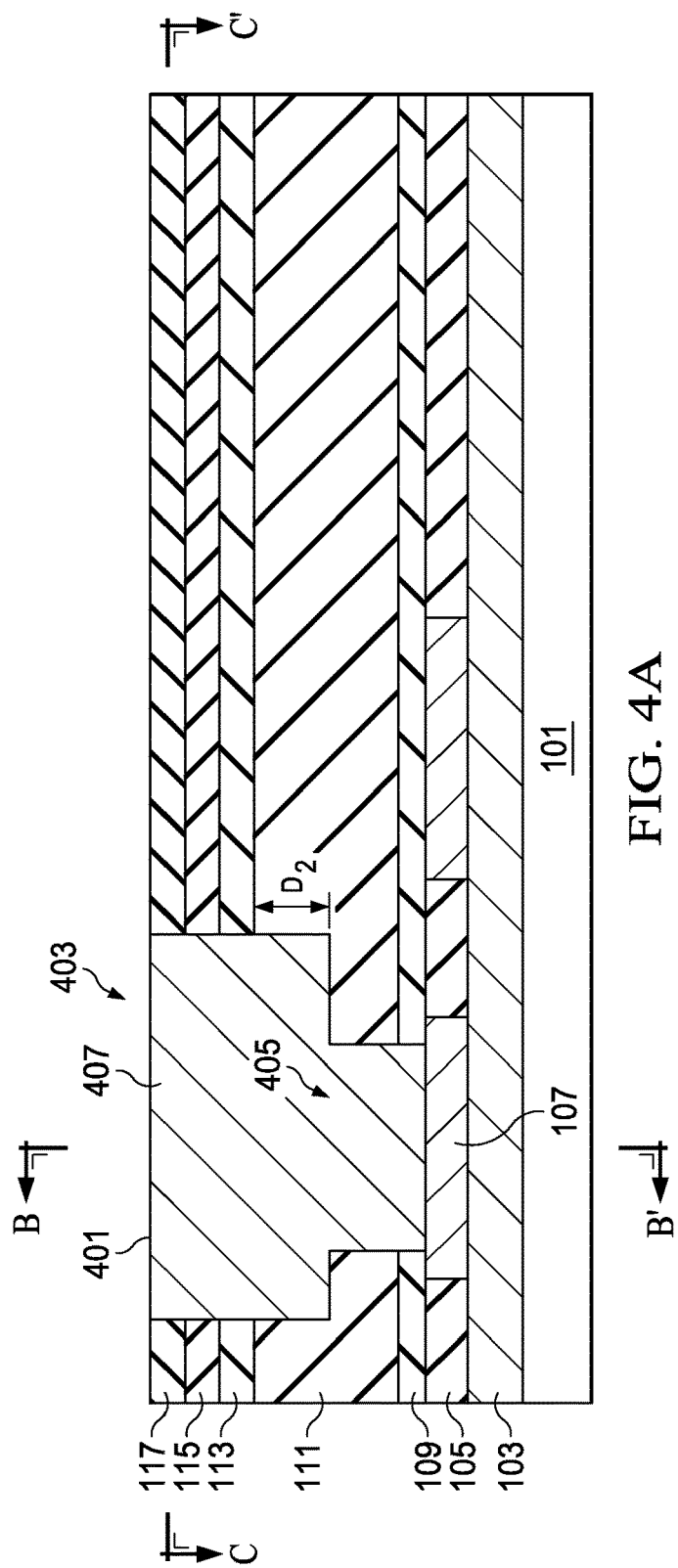
Figure 4B:
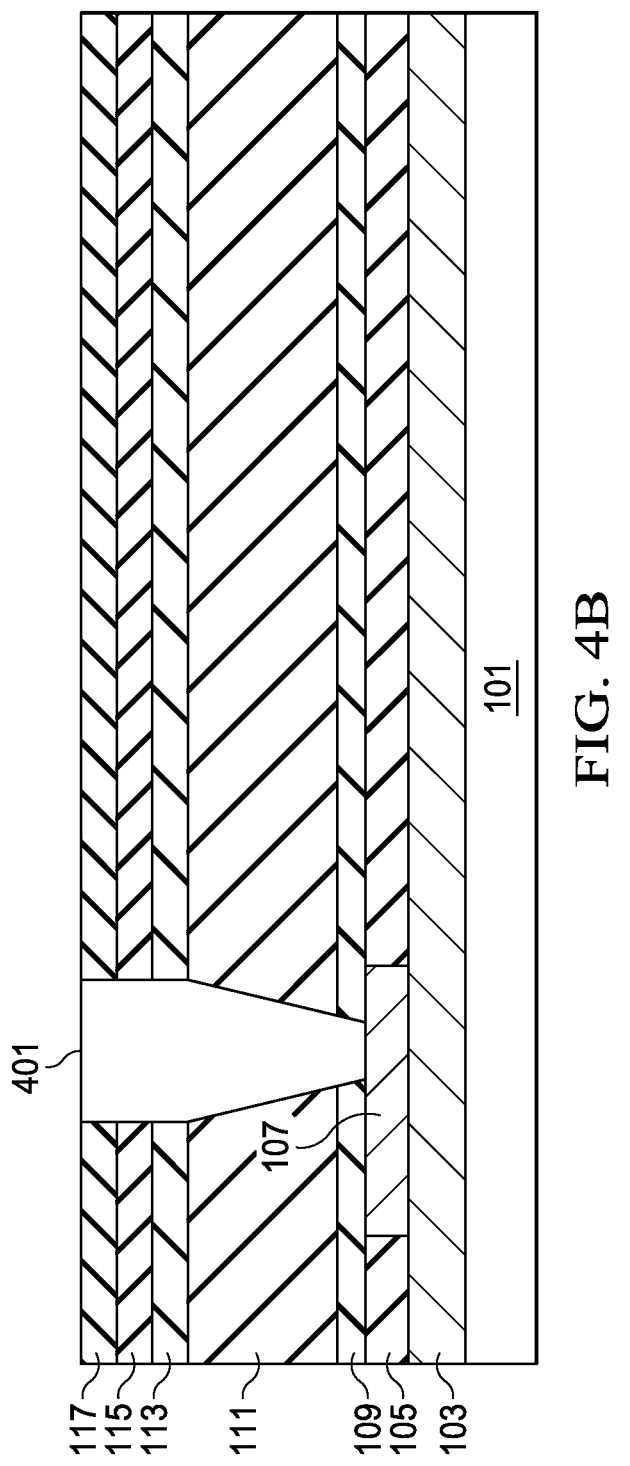

In an embodiment the second opening 125 may be formed to have a second width $W_2$ that will be used to pattern the via portion 405 of the interconnect 401 (not illustrated in FIGS. 1A-1C but illustrated and described in FIGS. 4A-4C). In an embodiment the second width $W_2$ is less than the first with $W_1$ and is between about 60 nm and about 80 nm such as about 70 nm. However, any suitable width may alternatively be utilized.

FIG. 1B illustrates another view of the structure described in FIG. 1A along line B-B' in FIG. 1A. As can be seen in this view, the second capping layer 117 and the hard mask layer 115 also have a third width $W_3$ that is narrower than the first width $W_1$ in the view of FIG. 1A. In an embodiment the third width $W_3$ is between about 30 nm and about 50 nm, such as about 40 nm. This allows the via portion 405 (described below in FIGS. 4A-4C) to maintain a consistent shape during formation.

FIG. 1C illustrates a top down view of the structure of FIG. 1A along line C-C'. However, for clarity, in this view only the second capping layer 117, the first opening 116, and the underlying conductive regions 107 (illustrated in dashed lines) are illustrated. As can be seen, the opening extends completely over one of the conductive regions 107 while also extending partially over another one of the conductive regions 107.

Figure 2A:
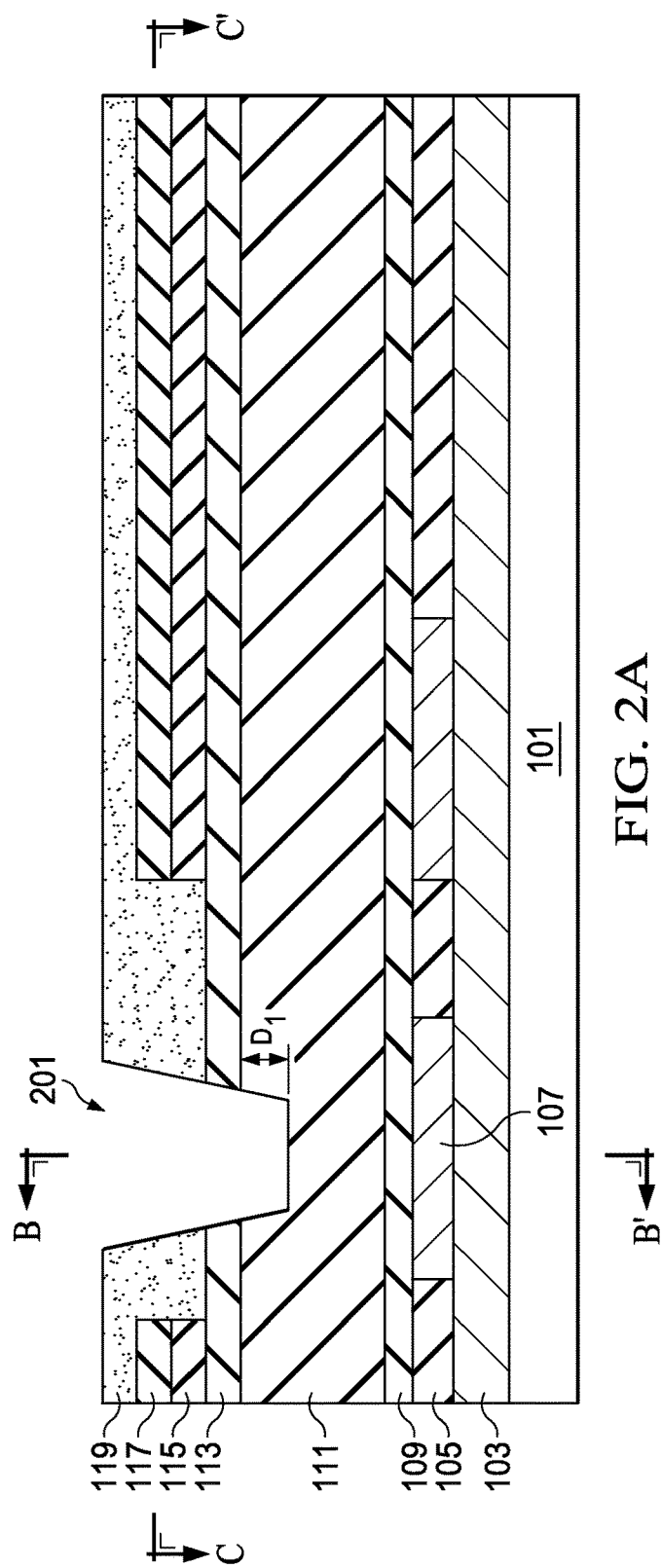
Figure 2B:
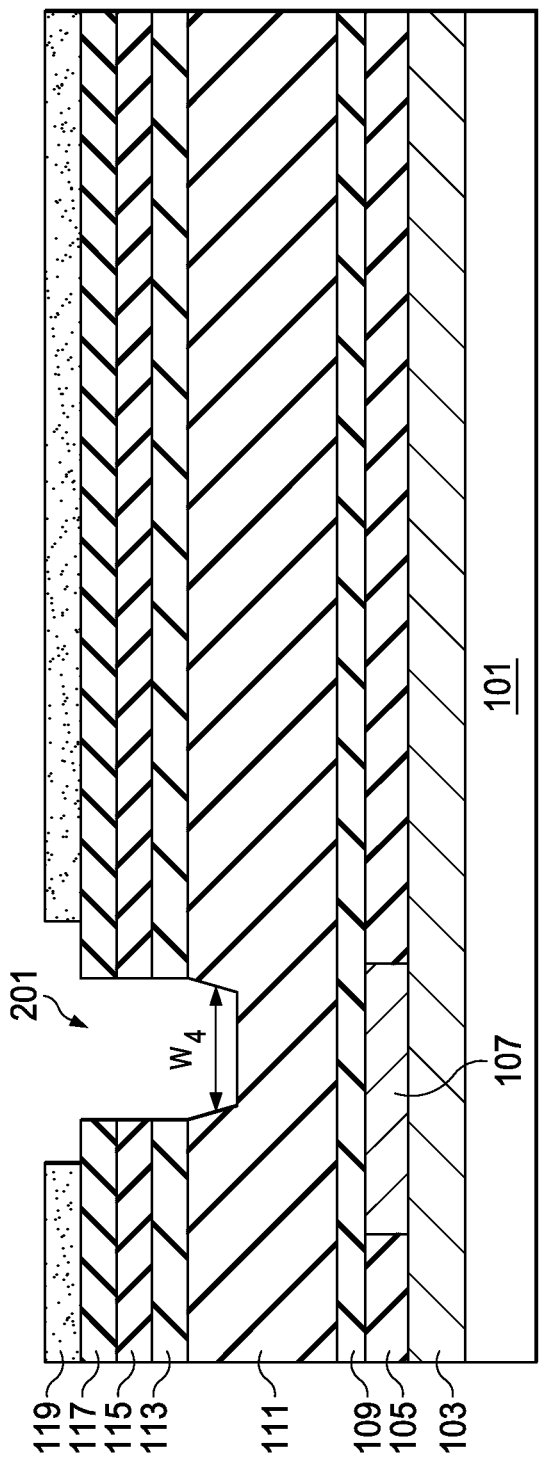

FIGS. 2A-2C illustrate a formation of a second opening 201 through the first capping layer 113 and into the second dielectric layer 111. In an embodiment the second opening 201 is formed using the top photoresist layer 123 as an etching mask during one or more etching processes, with each etchant being suitably chosen to remove the desired portions of each layer. As such, the original pattern of the top photoresist layer 123 (including the first opening 125) may be subsequently transferred through the intermediate mask layer 121 and the BARC layer 119. Continuing the etching processes, the second opening 201 may further be extended through the patterned second capping layer 117 and the hard mask layer 115. However, because the second width $W_2$ is less than the first width $W_1$, the second opening 201 does not actually expose any surface of the second capping layer 117 or the hard mask layer 115. In an embodiment the etching processes may continue until the second opening 201 has a first depth $D_1$ into the second dielectric layer 111 of between about 10 nm and about 50 nm, such as about 30 nm.

Once the pattern from the top photoresist layer 123 and the intermediate mask layer 121 has been transferred, the top photoresist layer 123 and the intermediate mask layer 121 may be removed from the remainder of the semiconductor device 100. In an embodiment the top photoresist layer 123 and the intermediate mask layer 121 may be removed using one or more etchings processes that are selective to the materials of the top photoresist layer 123 and the intermediate mask layer 121. The etching processes are continued until the top photoresist layer 123 and the intermediate mask layer 121 are fully removed from the BARC layer 119.

FIG. 2B illustrates another view of the structure described in FIG. 2A along line B-B' in FIG. 2A. As can be seen in this view as well, the second opening 201 extends through the BARC layer 119, the second capping layer 117, the hard mask layer 115, the first capping layer 113 and into the second dielectric layer 111. In this view however, it is apparent that a fourth width $W_4$ of the second opening 201 is constrained on two sides by the second capping layer 117 and the hard mask layer 115. As such, the fourth width $W_4$ remains similar to the second width $W_2$ described above, helps to keep any overlay misalignments from negatively affecting the position of the second opening along that direction.

FIG. 2C illustrates a top down view of the structure of FIG. 2A along line C-C'. However, for clarity, in this view only the second capping layer 117, the first opening 116, the second opening 201, and the underlying conductive regions 107 (illustrated in dashed lines) are illustrated. However, as can be seen, the first opening 116 extends beyond the second opening 201 in a first direction, but is restrained by the second capping layer 117 in a second direction.

Figure 3A:
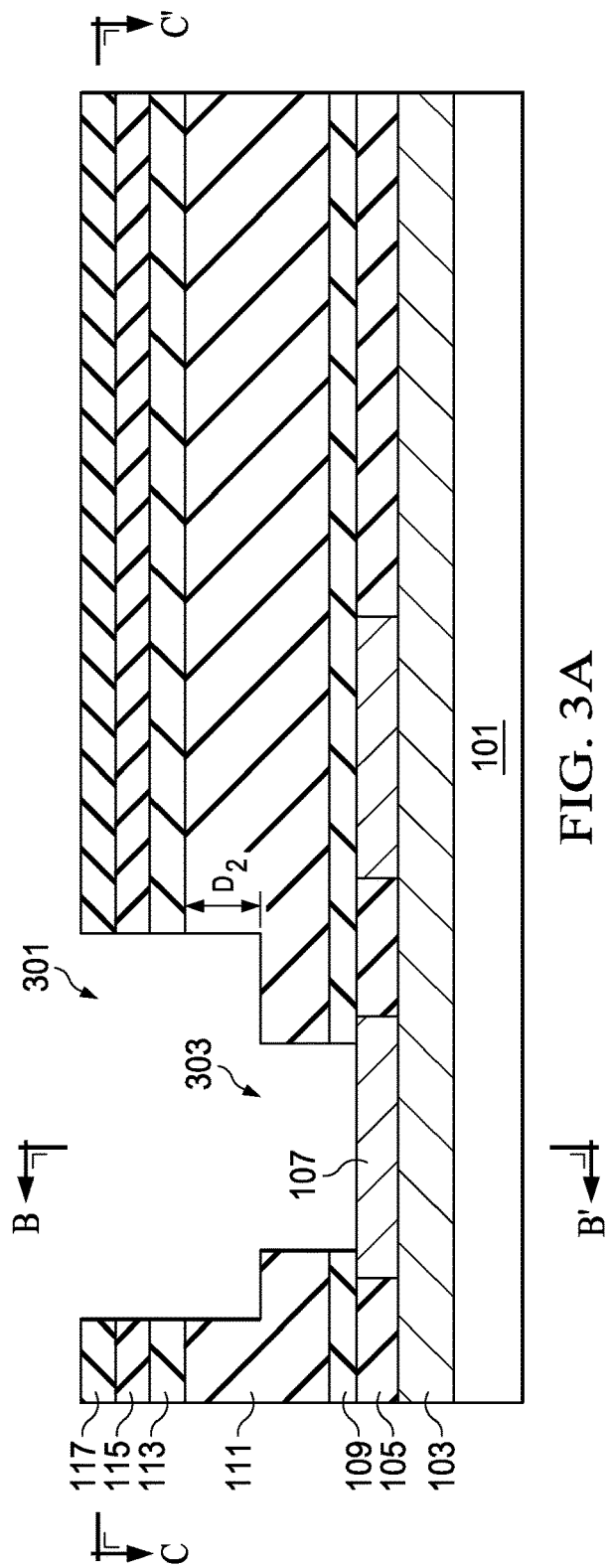
FIGS. 3A-3C illustrate a formation of a trench and via opening in accordance with an embodiment.
Figure 3B:
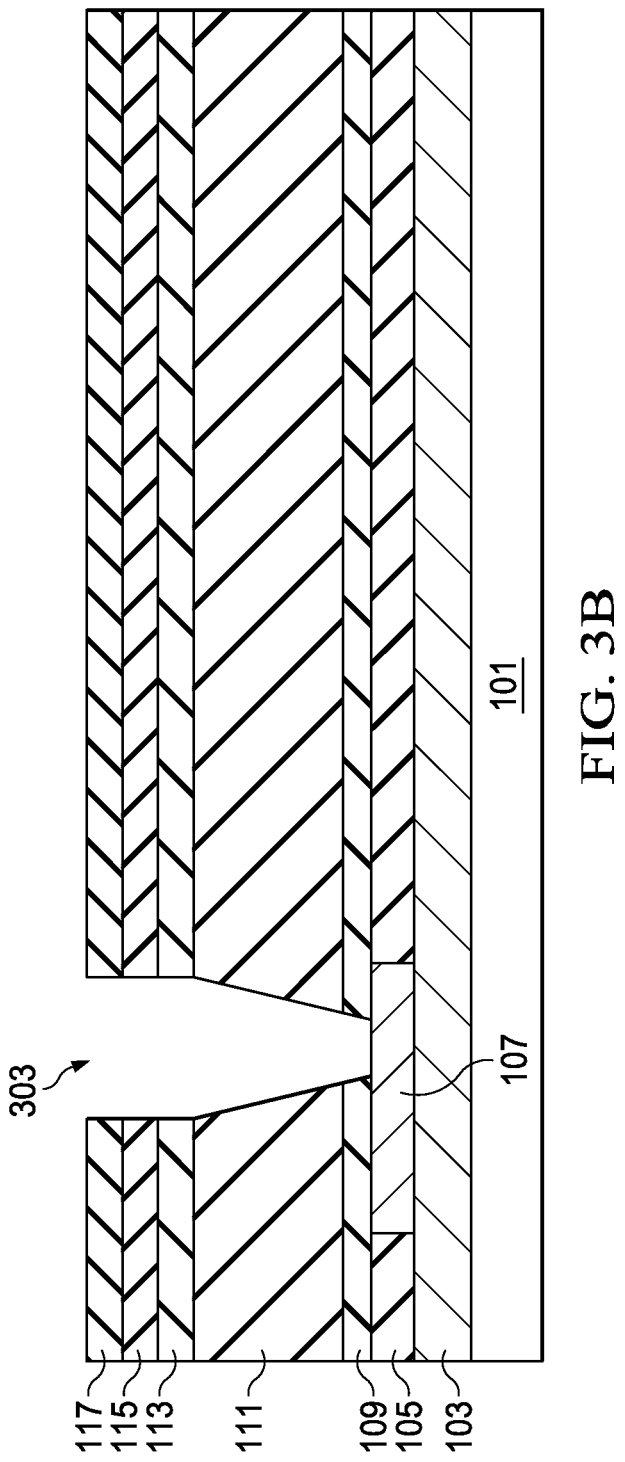
Figure 3C:
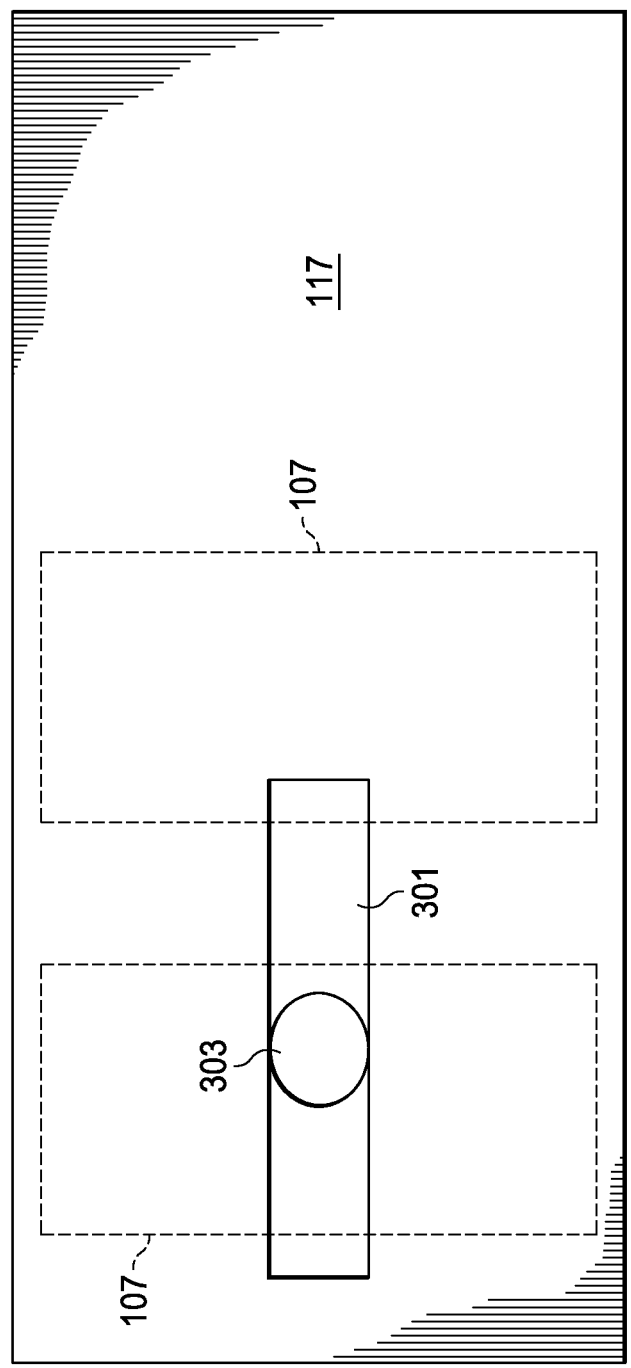

FIGS. 3A-3C illustrate a formation of a trench 301 and the extension of the second opening 201 (see FIGS. 2A-2C) to form a via opening 303 to the conductive regions 107. In an embodiment the BARC layer 119 is removed either prior to the formation of the trench 301 or during the formation of the trench 301. For example, if the BARC layer 119 is removed prior to the formation of the trench 301, then the BARC layer 119 may be removed using, e.g., an ashing process.

Alternatively, if the BARC layer 119 is removed during the formation of the trench 301, then the BARC layer 119 may be removed using one or more etching processes that will subsequently etch the second dielectric layer 111 using the patterned second capping layer 117 and hard mask layer 115 as masks. As such, the trench 301 in this view will have sidewalls that are aligned with the sidewalls of the second capping layer 117 and the hard mask layer 115. In an embodiment the etching processes may be continued until the trench 301 has a second depth $D_2$ into the second dielectric layer 111 of between about 40 nm and about 80 nm, such as about 60 nm.

Simultaneously, as the trench 301 is being formed, the etching processes utilized to form the trench will also extend the second opening 201 through the second dielectric layer 111. By extending the second opening through the second dielectric layer 111, the etching process with at least partially expose one of the conductive regions 107, thereby forming the via opening 303.

FIG. 3B illustrates another view of the structure described in FIG. 3A along line B-B' in FIG. 3A. In this view, instead of expanding the width of the first opening 125 to form the trench 301 and the via opening 303, the second capping layer 117 and the hard mask layer 115 constrain the expansion of the second opening 201. This results in only an extension of the second opening 201 to form the via opening 303 along this view.

FIG. 3C illustrates a top down view of the structure of FIG. 3A along line C-C'. However, for clarity, in this view only the second capping layer 117, the trench 301, the via opening 303, and the underlying conductive regions 107 (illustrated in dashed lines) are illustrated.

FIGS. 4A-4C illustrate a filling of the trench 301 and the via opening 303 to form an interconnect 401 with a trench portion 403 and a via portion 405. In an embodiment the trench 301 and the via opening 303, once formed, may be lined with a liner (not individually illustrated in FIGS. 4A-4C). The liner may be, e.g., an oxide formed from tetraethylorthosilicate (TEOS) or silicon nitride, although any suitable dielectric material may alternatively be used. The liner may be formed using a plasma enhanced chemical vapor deposition (PECVD) process, although other suitable processes, such as physical vapor deposition or a thermal process, may alternatively be used.

Once the liner has been formed along the sidewalls and bottom of the trench 301 and the via opening 303, a barrier layer (also not shown in FIGS. 4A-4C) may be formed and the remainder of the trench 301 and the via opening 303 may be filled with conductive material 407. The conductive material 407 may comprise copper, although other suitable materials such as aluminum, alloys, doped polysilicon, combinations thereof, and the like, may alternatively be utilized. The conductive material 407 may be formed by electroplating copper onto a seed layer (not shown), filling and overfilling the trench 301 and the via opening 303. Once the trench 301 and the via opening 303 have been filled, excess liner, barrier layer, seed layer, and conductive material 407 outside of the trench 301 and the via opening 303 may be removed through a planarization process such as chemical mechanical polishing (CMP), although any suitable removal process may be used.

FIGS. 5A-9 illustrate another embodiment in which a two-photoresist, two-etching (2P2E) process is utilized to form a second trench 901, a third trench 903, a second via 905, and a third via 907. Looking initially at FIG. 5A, in this embodiment a second BARC layer 501, a second intermediate mask layer 503, and a second top photoresist layer 505 may be placed over the second capping layer 117. In an embodiment the second BARC layer 501, the second intermediate mask layer 503, and the second top photoresist layer 505 may be similar to the BARC layer 119, the intermediate mask layer 121, and the top photoresist layer 123 as described above with respect to FIG. 1, although they may alternatively be different. Once applied, the second top photoresist layer 505 may be patterned by exposing the second top photoresist layer 505 to a patterned energy source (e.g., light) and developing the second top photoresist layer 505. However, instead of patterning the second top photoresist layer 505 into a pattern for a via, in this embodiment the second top photoresist layer 505 is patterned to help form the second trench 901 (not illustrated in FIG. 5A but illustrated and discussed below with respect to FIG. 9).

Figure 5A:
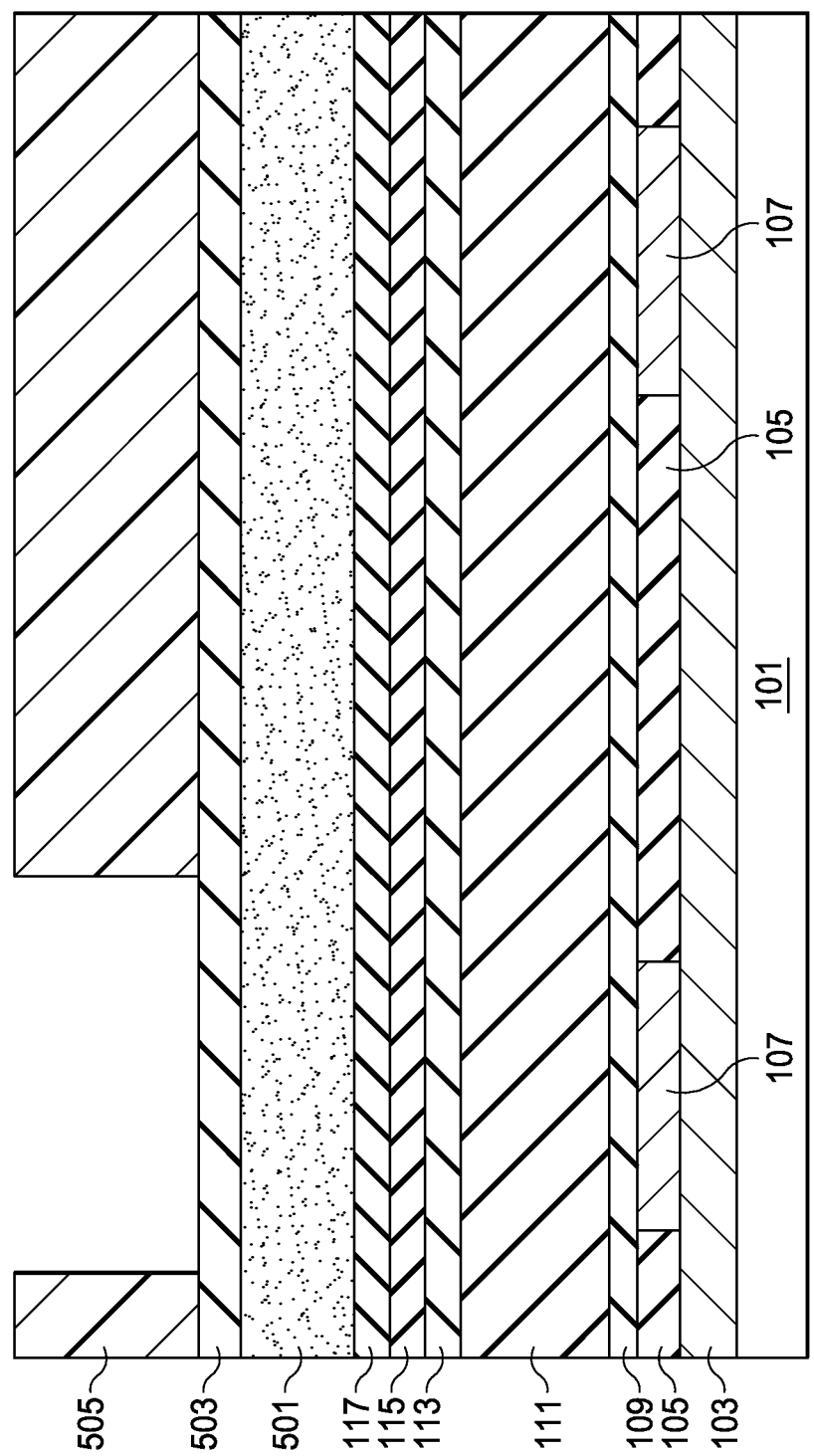
FIGS. 5A-5B, 6A-6B, 7A-7B, 8A-8B, and 9 illustrate a two photoresist two etching process in accordance with an embodiment.
Figure 5B:
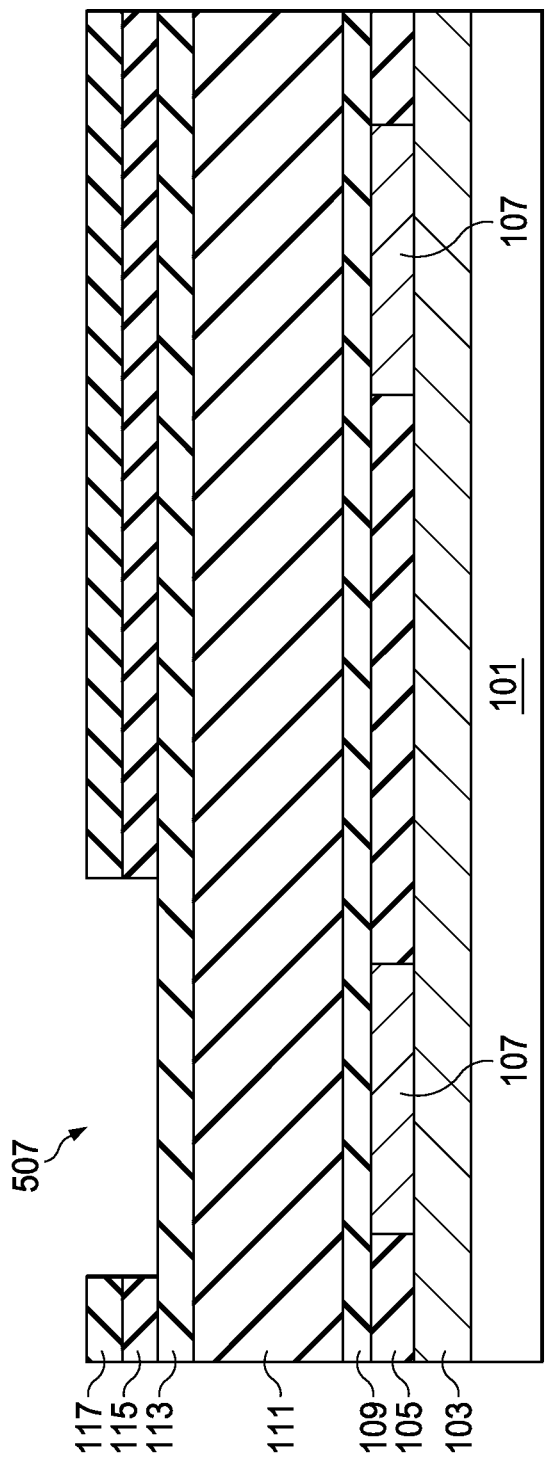

FIG. 5B illustrates that, once the second top photoresist layer 505 has been developed, the pattern of the second top photoresist layer 505 may be transferred to the second intermediate mask layer 503, the second BARC layer 501, the second capping layer 117, and the hard mask layer 115 in order to form a first portion 507 that will be extended later (see, e.g., FIG. 9 and the corresponding discussion) to help form the second trench 901. In an embodiment one or more etching processes may be utilized to transfer the pattern as described above with respect to FIG. 2A, although any other suitable method may alternatively be utilized. Once the pattern has been transferred to form the first portion 507, the second top photoresist layer 505, the second intermediate mask layer 503, and the second BARC layer 501 may be removed.

Figure 6A:
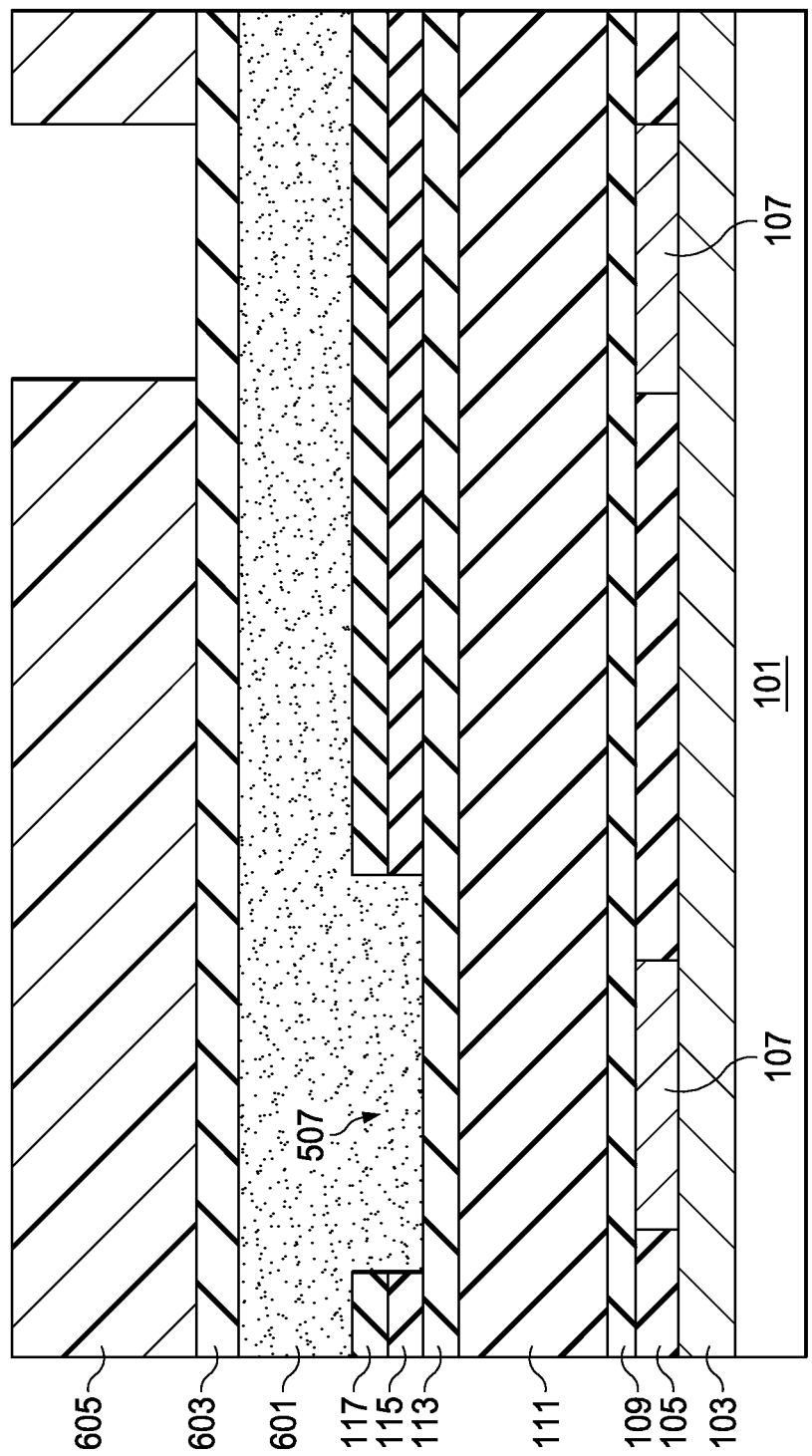

FIG. 6A illustrates the placement of a third BARC layer 601, a third intermediate mask layer 603, and a third top photoresist layer 605 may be placed over the second capping layer 117. In an embodiment the third BARC layer 601, the third intermediate mask layer 603, and the third top photoresist layer 605 may be similar to the BARC layer 119, the intermediate mask layer 121, and the top photoresist layer 123 as described above with respect to FIG. 1, although they may alternatively be different. Once applied, the third top photoresist layer 605 may be patterned by exposing the third top photoresist layer 605 to a patterned energy source (e.g., light) and developing the third top photoresist layer 605. However, instead of patterning the third top photoresist layer 605 into a pattern for a via, in this embodiment the third top photoresist layer 605 is patterned to form a second portion 607 (not illustrated in FIG. 6A but illustrated and discussed below with respect to FIG. 6B) for a third trench 903 (not illustrated in FIG. 6A but illustrated and discussed below with respect to FIG. 9).

Figure 6B:
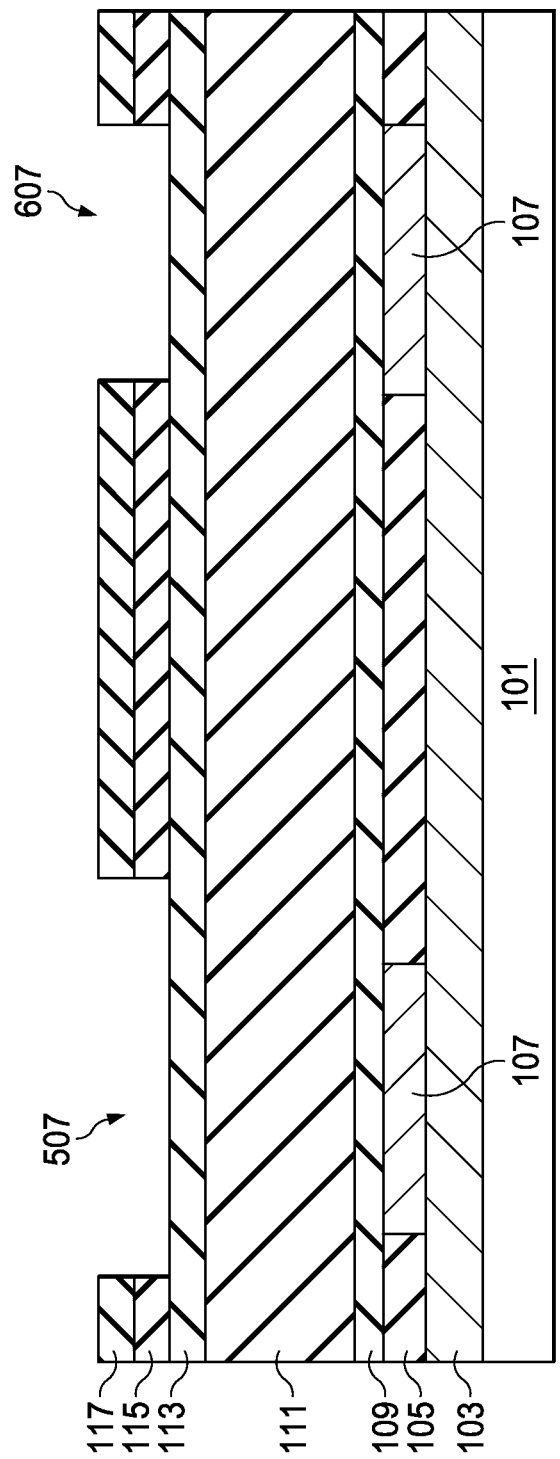

FIG. 6B illustrates that, once the third top photoresist layer 605 has been developed, the pattern of the third top photoresist layer 605 may be transferred to the third intermediate mask layer 603, the third BARC layer 601, the third capping layer 117, and the hard mask layer 115 in order to form the second portion 607 that will be extended later (see, e.g., FIG. 9 and the corresponding discussion) to help form the third trench 903. In an embodiment one or more etching processes may be utilized to transfer the pattern as described above with respect to FIG. 2A, although any other suitable method may alternatively be utilized. Once the pattern has been transferred to form the second portion 607, the third top photoresist layer 605, the third intermediate mask layer 603, and the third BARC layer 601 may be removed.

Figure 7A:
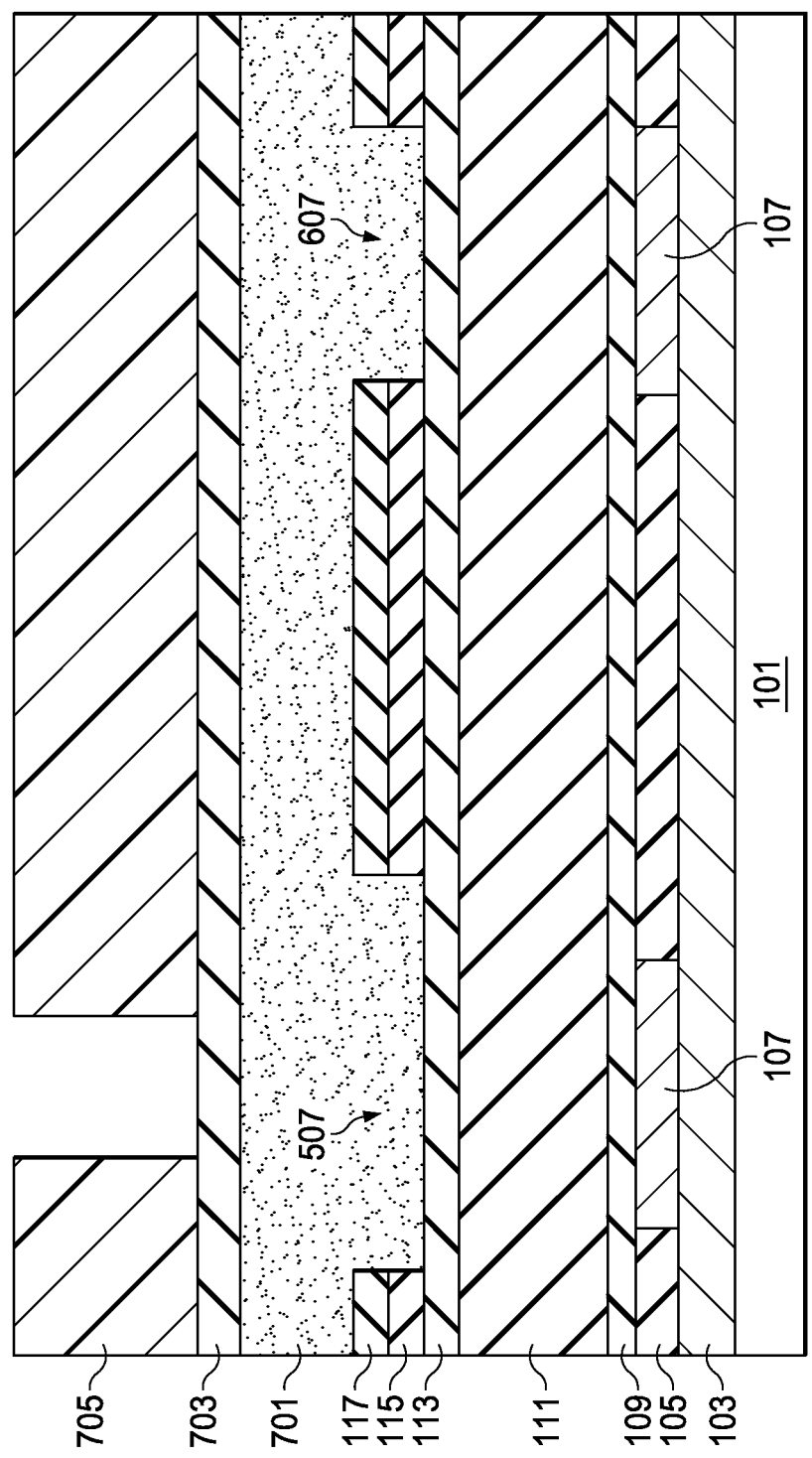

FIG. 7A illustrates the placement of a fourth BARC layer 701, a fourth intermediate mask layer 703, and a fourth top photoresist layer 705 over the second capping layer 117. In an embodiment the fourth BARC layer 701, the fourth intermediate mask layer 703, and the fourth top photoresist layer 705 may be similar to the BARC layer 119, the intermediate mask layer 121, and the top photoresist layer 123 as described above with respect to FIG. 1, although they may alternatively be different. Once applied, the fourth top photoresist layer 705 may be patterned by exposing the fourth top photoresist layer 705 to a patterned energy source (e.g., light) and developing the fourth top photoresist layer 705. However, instead of patterning the fourth top photoresist layer 705 into a pattern for a trench, the fourth top photoresist layer 705 is patterned to form a fourth portion 707 for a second via 905 (not illustrated in FIG. 7A but illustrated and discussed below with respect to FIG. 9).

Figure 7B:
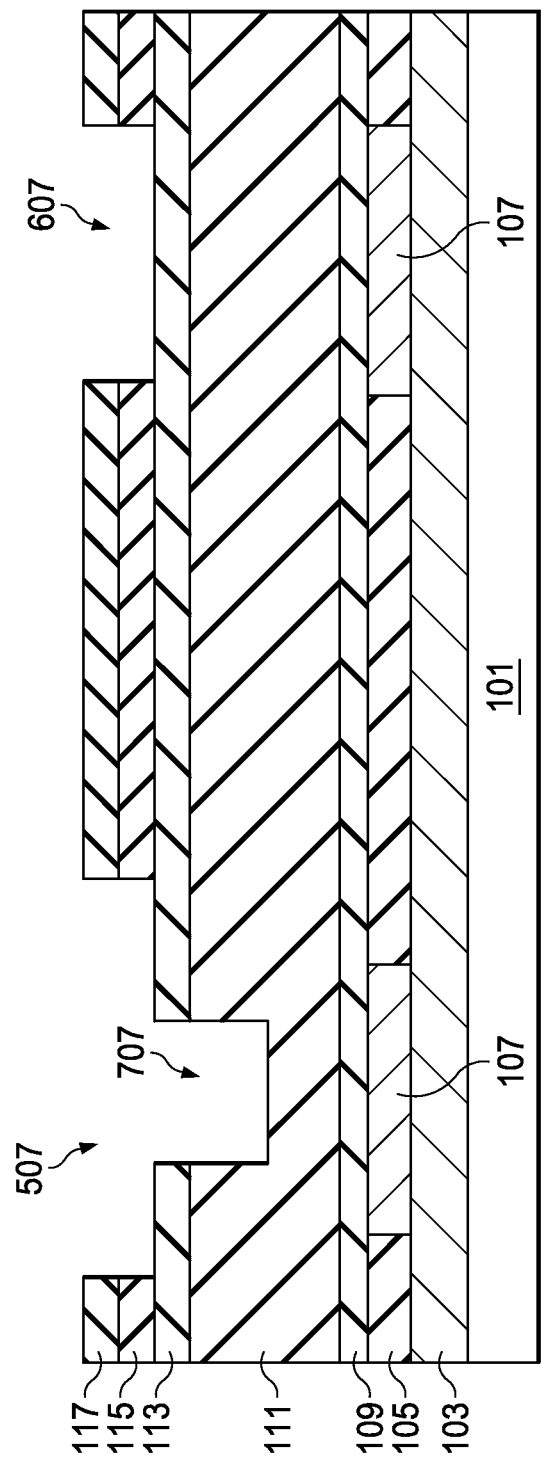

FIG. 7B illustrates that, once the fourth top photoresist layer 705 has been developed, the pattern of the fourth top photoresist layer 705 may be transferred to the fourth intermediate mask layer 703, the fourth BARC layer 701, the third capping layer 117, the hard mask layer 115, the first capping layer 113, and the second dielectric layer 111 in order to form a third portion 707 that will be extended later (see, e.g., FIG. 9 and the corresponding discussion) to help form the second via 905. In an embodiment one or more etching processes may be utilized to transfer the pattern as described above with respect to FIG. 2A, although any other suitable method may alternatively be utilized. Once the pattern has been transferred to form the third portion 707, the fourth top photoresist layer 705, the fourth intermediate mask layer 703, and the fourth BARC layer 701 may be removed.

Figure 8A:
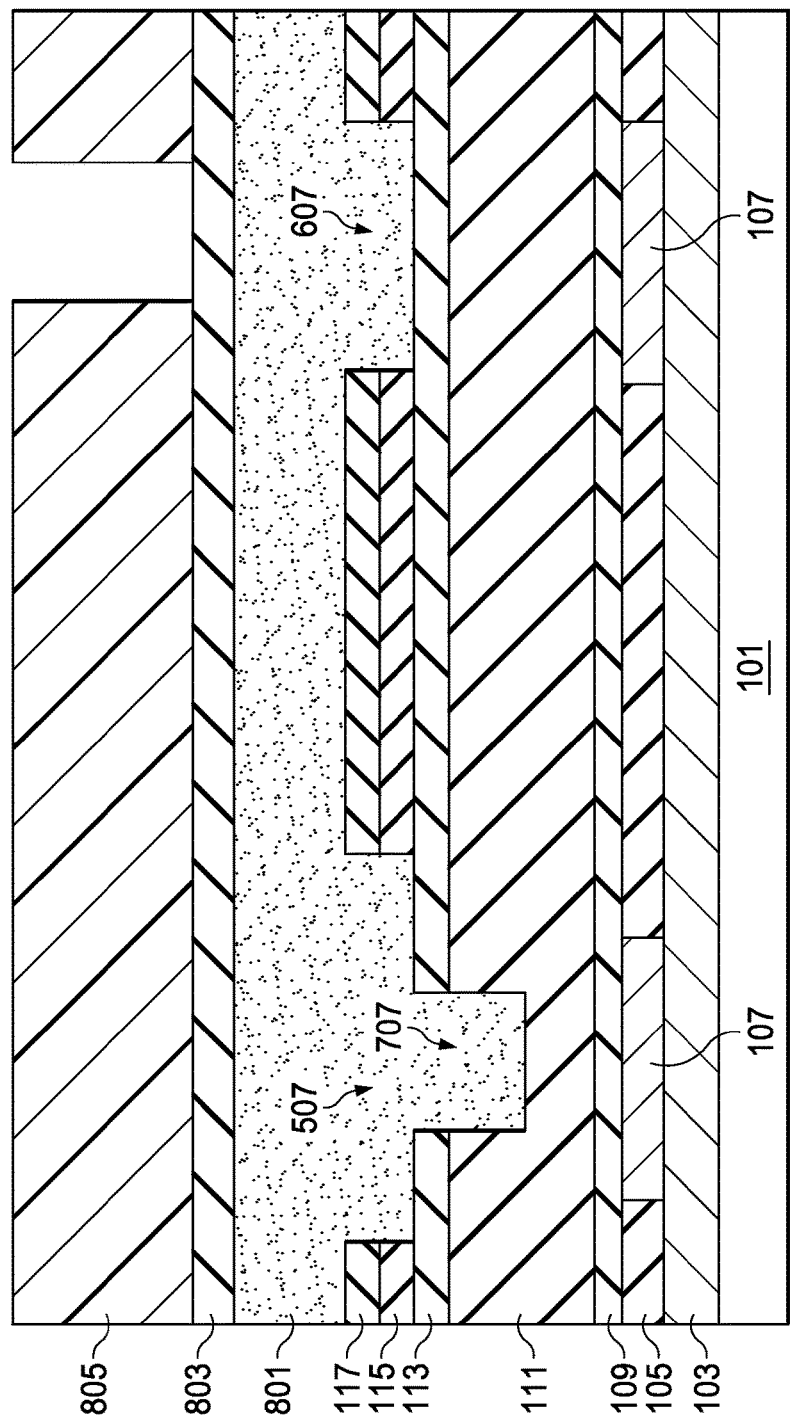

FIG. 8A illustrates the placement of a fifth BARC layer 801, a fifth intermediate mask layer 803, and a fifth top photoresist layer 805 may be placed over the second capping layer 117. In an embodiment the fifth BARC layer 801, the fifth intermediate mask layer 803, and the fifth top photoresist layer 805 may be similar to the BARC layer 119, the intermediate mask layer 121, and the top photoresist layer 123 as described above with respect to FIG. 1, although they may alternatively be different. Once applied, the fifth top photoresist layer 805 may be patterned by exposing the fifth top photoresist layer 805 to a patterned energy source (e.g., light) and developing the fifth top photoresist layer 805. However, instead of patterning the fifth top photoresist layer 805 into a pattern for a trench, the fifth top photoresist layer 805 is patterned to form a fourth portion 807 for a third via 907 (not illustrated in FIG. 8A but illustrated and discussed below with respect to FIG. 9).

Figure 8B:
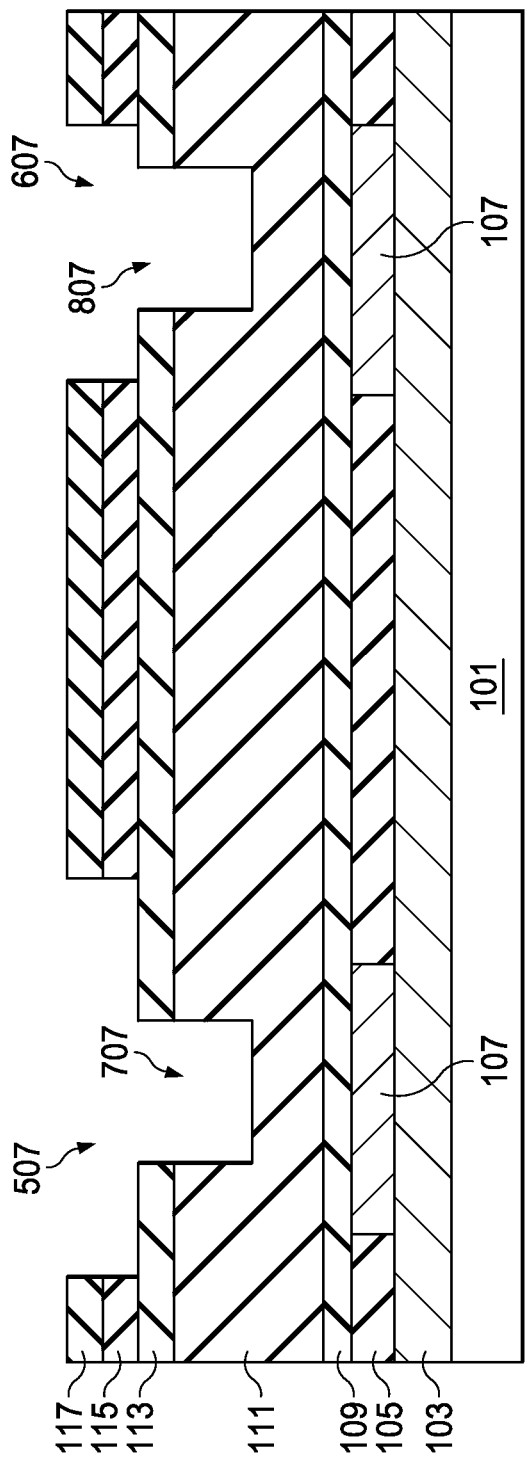

FIG. 8B illustrates that, once the fifth top photoresist layer 805 has been developed, the pattern of the fifth top photoresist layer 805 may be transferred to the fifth intermediate mask layer 803, the fifth BARC layer 801, the third capping layer 117, the hard mask layer 115, the first capping layer 113, and the second dielectric layer 111 in order to form a fourth portion 807 that will be extended later (see, e.g., FIG. 9 and the corresponding discussion) to help form the third via 907. In an embodiment one or more etching processes may be utilized to transfer the pattern as described above with respect to FIG. 2A, although any other suitable method may alternatively be utilized. Once the pattern has been transferred to form the fourth portion 807, the fifth top photoresist layer 805, the fifth intermediate mask layer 803, and the fifth BARC layer 801 may be removed.

Figure 9:
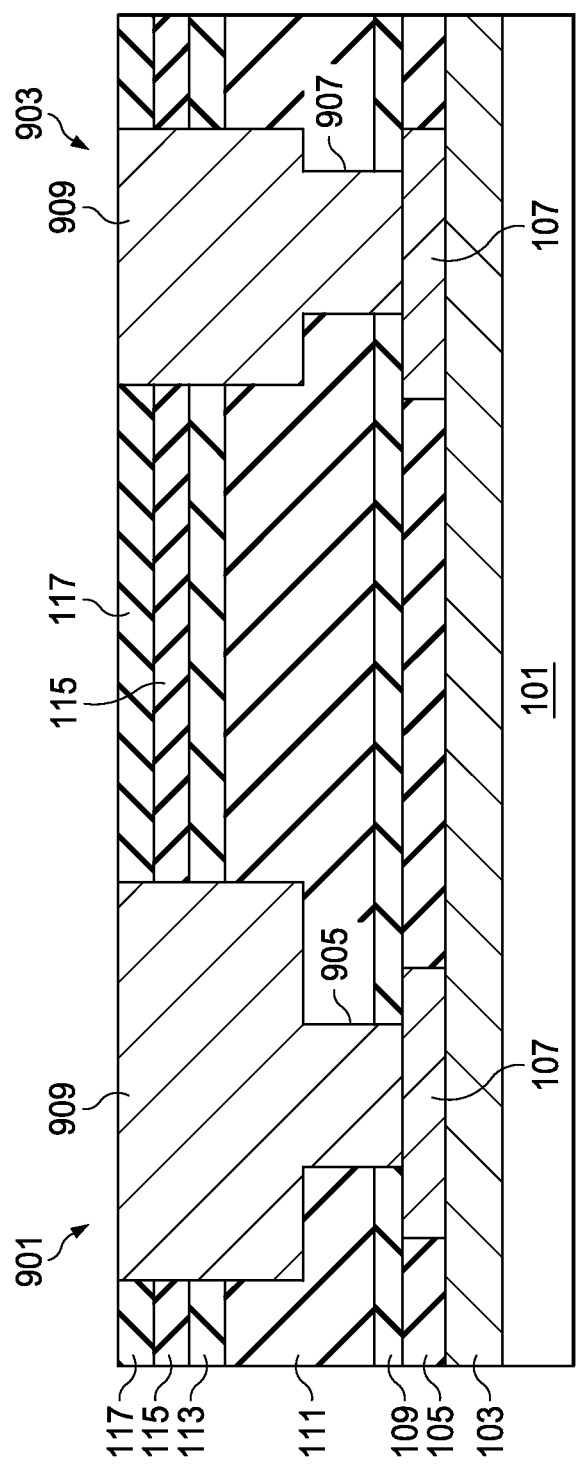

FIG. 9 illustrates an extension of the first portion 507, the second portion 607, the third portion 707, and the fourth portion 807 in order to help form the second via 905, the third via 907, the second trench 901, and the third trench 903. In an embodiment the extension may be performed using the second capping layer 117 as a mask to protect underlying structures. The extension may be performed using a similar process as the one described above with respect to FIG. 3A, such as the use of one or more etching processes to expose a portion of the underlying conductive regions 107.

Once the openings for second via 905, the third via 907, the second trench 901 and the third trench 903 have been formed, the second via 905, the third via 907, the second trench 901 and the third trench 903 may be lined with a liner (not individually illustrated in FIG. 9). The liner may be, e.g., an oxide formed from tetraethylorthosilicate (TEOS) or silicon nitride, although any suitable dielectric material may alternatively be used. The liner may be formed using a plasma enhanced chemical vapor deposition (PECVD) process, although other suitable processes, such as physical vapor deposition or a thermal process, may alternatively be used.

Once the liner has been formed, a barrier layer (also not shown in FIG. 9) may be formed and the remainder of the second via 905, the third via 907, the second trench 901 and the third trench 903 may be filled with conductive material 909. The conductive material 909 may comprise copper, although other suitable materials such as aluminum, alloys, doped polysilicon, combinations thereof, and the like, may alternatively be utilized. The conductive material 909 may be formed by electroplating copper onto a seed layer (not shown), filling and overfilling the second via 905, the third via 907, the second trench 901 and the third trench 903. Once the second via 905, the third via 907, the second trench 901 and the third trench 903 have been filled, excess liner, barrier layer, seed layer, and conductive material 909 outside of the second via 905, the third via 907, the second trench 901 and the third trench 903 may be removed through a planarization process such as chemical mechanical polishing (CMP), although any suitable removal process may be used.

By utilizing the processes and layers described above, such as the second capping layer 117, via-induced-metal-bridge defects and via-to-via leakage defects may be reduced or eliminated, especially for double-patterning lithography at a 20 nm technology node or beyond. Additionally, the dielectric breakdown voltage and time dependent dielectric breakdown window can be improved, enhancing the Rc yield window and making the semiconductor device have better Rc uniformity.

In accordance with an embodiment, a semiconductor device comprising a dielectric layer over a substrate, a nitrogen free anti-reflection layer overlying the dielectric layer, and a hard mask over the dielectric layer is provided. A capping layer is in physical contact with the hard mask, wherein the capping layer has a selectivity to the dielectric layer greater than about 1:5, and an interconnect comprising a trench portion and a via portion, the interconnect extends through the capping layer, the hard mask, and the dielectric layer.

In accordance with another embodiment, a method of manufacturing a semiconductor device comprising depositing a dielectric layer over a substrate, depositing a hard mask layer over the dielectric layer, and depositing a capping layer over the hard mask layer, wherein the capping layer has a selectivity relative to the dielectric layer of greater than about 1:5, is provided. A nitrogen free anti-reflection layer is applied to the capping layer, and the nitrogen free anti-reflection layer, the capping layer, and the hard mask layer are patterned into a first trench portion. The capping layer and the hard mask layer are patterned into a second trench portion using a different process than the patterning the nitrogen free anti-reflection layer, the capping layer, and the hard mask layer into a first trench portion. The dielectric layer is patterned into a first via portion through the first trench portion. The dielectric layer is patterned into a second via portion through the second trench portion, and the first trench portion, the second trench portion, the first via portion, and the second via portion are extended to form a first trench, a second trench, a first via, and a second via.

In accordance with yet another embodiment, a method of manufacturing a semiconductor device comprising depositing a dielectric layer over a substrate, depositing a nitrogen free anti-reflection layer overlying the dielectric layer and depositing a hard mask layer over the dielectric layer is provided. A capping layer is deposited over the hard mask layer, wherein the capping layer has a selectivity relative to the dielectric layer of greater than about 1:5, and the capping layer and the hard mask layer are patterned to form a first opening. A second opening is formed in the dielectric layer through the first opening, wherein the second opening has two sides aligned with the first opening and two sides that are not aligned with the first opening. A trench is formed and the second opening is extended, wherein the extending the second opening extends the second opening through the dielectric layer to form a via opening.

Although the present embodiments and their advantages have been described in detail, it should be understood that various changes, substitutions and alterations can be made herein without departing from the spirit and scope of the disclosure as defined by the appended claims. For example, different materials and different processes may be utilized to form the various layers.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device comprising:
a hard mask layer over and in physical contact with a dielectric layer;
a capping layer over and in physical contact with the hard mask layer; and
a conductive material extending through the hard mask layer and the capping layer, wherein in a first direction the conductive material has a first width within the capping layer and a second width within the dielectric layer, the conductive material having a smooth transition from the first width to the second width, and wherein in a second direction the conductive material has a third width within the hard mask layer and the dielectric layer and a fourth width in the dielectric layer, the conductive material having a stair-step transition from the third width to the fourth width.

2. The semiconductor device of claim 1, wherein the first width is greater than the second width.

3. The semiconductor device of claim 1, wherein the first width is a width of a trench portion of the conductive material and wherein the second width is a width of a via portion of the conductive material.

4. The semiconductor device of claim 1, wherein the capping layer comprises a nitride material.

5. The semiconductor device of claim 4, wherein the nitride material is silicon nitride, silicon oxynitride, silicon carbon nitrogen, or silicon carbon oxynitride.

6. The semiconductor device of claim 1, wherein the capping layer has a thickness of between about 100 Å and about 2000 Å.

7. The semiconductor device of claim 6, wherein the capping layer has a thickness of less than about 500 Å.

8. A semiconductor device comprising:
a dielectric layer over a substrate;
a conductive region having a first portion, a second portion, and a third portion, the first portion being most proximal to the substrate, the third portion being most distal from the substrate, the second portion being interposed between the first portion and the third portion, the first portion and the second portion being embedded within the dielectric layer, the conductive region having a first cross-section and a second cross-section, planes of the first and second cross-sections being perpendicular to one another and perpendicular to a major surface of the substrate, in the first cross-section the first portion and the second portion having slanted sidewalls, in the first cross-section the third portion having sidewalls non-parallel and non-perpendicular to the slanted sidewalls, the first portion having sidewalls in the first cross-section with a different slope than sidewalls of the first portion in the second cross-section;
an anti-reflective layer adjacent to the dielectric layer, wherein the anti-reflective layer is free from nitrogen;
a masking layer adjacent to the anti-reflective layer; and
a capping layer adjacent to the masking layer.

9. The semiconductor device of claim 8, wherein the capping layer comprises a carbide material.

10. The semiconductor device of claim 9, wherein the carbide material is boron carbide or silicon carbide.

11. The semiconductor device of claim 8, wherein the capping layer is a nitride material.

12. The semiconductor device of claim 11, wherein the nitride material is silicon nitride, silicon oxynitride, silicon carbon nitrogen, or silicon carbon oxynitride.

13. The semiconductor device of claim 8, wherein the capping layer has a thickness of between about 100 Å and about 500 Å.

14. A semiconductor device comprising:
a dielectric layer over a substrate;
a hard mask over the dielectric layer;
a capping layer in physical contact with the hard mask; and
an interconnect comprising a trench and a via, the trench comprising an upper portion and a bottom portion, the interconnect having a first cross-section and a second cross-section, the first cross-section being perpendicular to the second cross-section, the first cross-section and the second cross-section being perpendicular to a major surface of the substrate, in the first cross-section the trench comprising a same width in the upper portion and in the bottom portion, the interconnect having a stair-step shape from the trench to the via in the first cross-section, in the second cross-section the upper portion having sidewalls with a different slope than in the bottom portion, sidewalls of the via in the first cross-section having a different slope than sidewalls of the via in the second cross-section.

15. The semiconductor device of claim 14, wherein the capping layer is a nitride.

16. The semiconductor device of claim 15, wherein the capping layer is silicon nitride, silicon oxynitride, silicon carbon nitrogen, or silicon carbon oxynitride.

17. The semiconductor device of claim 14, wherein the capping layer is a carbide.

18. The semiconductor device of claim 17, wherein the carbide is boron carbide or silicon carbide.

19. The semiconductor device of claim 14, wherein in the stair-step shape is within the dielectric layer.

20. The semiconductor device of claim 14, wherein in the second cross-section the upper portion further comprises a vertical sidewall extending from a top of the dielectric layer to a top of the capping layer, the vertical sidewall being perpendicular to the major surface of the substrate.

* * * * *